US008849882B2

(12) United States Patent
Aouini et al.

(10) Patent No.: US 8,849,882 B2
(45) Date of Patent: Sep. 30, 2014

(54) GENERATION OF AN ANALOG GAUSSIAN NOISE SIGNAL HAVING PREDETERMINED CHARACTERISTICS

(75) Inventors: Sadok Aouini, Montreal (CA); Gordon W. Roberts, Montreal-West (CA)

(73) Assignees: The Royal Institution for the Association of Learning, Montreal (CA); McGill University, Montreal (CA)

( * ) Notice: Subject to any disclaimer, the term of this patent is extended or adjusted under 35 U.S.C. 154(b) by 1166 days.

(21) Appl. No.: 12/254,149

(22) Filed: Oct. 20, 2008

(65) Prior Publication Data
US 2009/0121749 A1 May 14, 2009

Related U.S. Application Data

(60) Provisional application No. 60/960,915, filed on Oct. 19, 2007.

(51) Int. Cl.
G06F 7/58 (2006.01)
H03B 29/00 (2006.01)
(52) U.S. Cl.
CPC .................................. *H03B 29/00* (2013.01)
USPC .......................................................... 708/250
(58) Field of Classification Search
CPC .................................. G06F 7/58; H03K 3/84
USPC .......................................................... 708/250
See application file for complete search history.

(56) References Cited

U.S. PATENT DOCUMENTS

| 5,379,040 | A | * | 1/1995 | Mizomoto et al. | 341/143 |
|---|---|---|---|---|---|
| 5,675,581 | A | * | 10/1997 | Soliman | 370/252 |
| 5,848,160 | A | * | 12/1998 | Cai et al. | 380/44 |
| 6,809,669 | B1 | * | 10/2004 | Robinson | 341/131 |
| 6,917,223 | B2 | * | 7/2005 | Allred | 327/100 |
| 7,479,837 | B2 | * | 1/2009 | Muecke et al. | 331/78 |
| 2001/0016863 | A1 | * | 8/2001 | Uchino et al. | 708/271 |
| 2002/0103838 | A1 | * | 8/2002 | Kelly | 708/3 |
| 2007/0024384 | A1 | * | 2/2007 | Muecke et al. | 331/78 |

OTHER PUBLICATIONS

Evans, G., et al., "On-Chip Built-In Self-Test of Video-Rate ADCs Using a 1.5 V SMOS Gaussian Noise Generator"; IEEE ISCAS, 2005, pp. 669-672.
Hafed, Mohamed et al., "Test and Evaluation of Multiple Embedded Mixed-Signal Test Cores"; IEEE, ITC, 2002, pp. 1022-1030.
Geens, Alain et al., "Discussion on Fundamental Issues of NPR Measurements", IEEE Trans. on Instrumentation and Measuremnt, vol. 52, No. 1, Feb. 2003, pp. 197-0202.
Bhattacharya, Soumendu, et al., "Test Time Reduction for ACPR Measurement of Wireless Transceivers Using Periodic Bit-Stream Sequences", Proc. IEEE International Workshop on Electronic Design, Test and Applications, Jan. 2004, pp. 372-377.

* cited by examiner

*Primary Examiner* — Chuong D Ngo
(74) *Attorney, Agent, or Firm* — Freedman & Associates

(57) ABSTRACT

The present invention relates to a method and system for providing an analog Gaussian noise signal having the predetermined probability distribution function, bandwidth and center frequency. A band-limited digital noise signal indicative of a Gaussian noise signal having a predetermined Gaussian probability distribution function is ΣΔ modulated generating a pulse-density modulated 1-bit sequence representing a Gaussian noise signal having a predetermined probability distribution function, bandwidth and center frequency. Using an analog low-pass filter the pulse-density modulated 1-bit sequence is then converted into a respective analog Gaussian noise signal having the predetermined probability distribution function, bandwidth and center frequency. The method and system are successfully employed in numerous applications such as in histogram testing and probabilistic digitization.

4 Claims, 28 Drawing Sheets

GENERATION OF AN ANALOG GAUSSIAN NOISE SIGNAL HAVING PREDETERMINED CHARACTERISTICS

FIELD OF THE INVENTION

This invention relates to generation of Gaussian noise and in particular to a method and system for generating an analog Gaussian noise signal having predetermined characteristics.

BACKGROUND OF THE INVENTION

There are numerous physical phenomena affecting performance of electronic circuits such as, for example, thermal noise in resistors, oscillations in power supplies, interference signals in transceivers, and jitter in clocks. Based on the Central Limit Theorem, which states that even when individual random variables are not normally distributed their sums and averages will tend to follow a normal distribution, it is in many situations possible to model these physical phenomena using a Gaussian Probability Distribution Function (PDF). Being able to accurately model these physical phenomena is paramount in testing of present day electronic circuits and their components. A Gaussian noise generator has a wide variety of applications ranging from electronic testing and modeling to communication channel emulation. For example, it is possible to use a Gaussian noise source for determining a Bit Error Rate (BER) in digital communication channels. Furthermore, it has been shown in G. Evans, J. Goes, and N. Paulino: "*On-Chip Built-in Self-Test of Video-Rate ADCs using a 1.5 V CMOS Noise Generator*", IEEE ISCAS, 2005, pp. 796-799, how histogram testing using a Gaussian noise test signal is performed for DNL/INL measurements in video-rate Analog-to-Digital Converters (ADCs).

Typically, analog Gaussian noise signals are generated either by low-pass filtering the output signal of a Linear Feedback Shift Register (LFSR)—first method—or by amplifying the thermal noise of a resistor—second method. Unfortunately, both these methods do not allow a user to define the characteristics—mean and standard deviation of the probability distribution function—of the Gaussian noise signal. Furthermore, the Gaussian noise signal generated using the first method does not accurately follow a Gaussian PDF and the Gaussian noise signal generated using the second method is substantially affected by process variations such as temperature of the resistor. Digital implementations of pseudo-random Gaussian signal sources employing, for example, the Box-Muller method have successfully been realized. However, converting the multi-bit Gaussian pseudo-random numbers into an analog Gaussian noise signal is not a trivial task requiring a highly complex Digital-to Analog conversion satisfying very stringent specifications.

It would be highly desirable to overcome the above limitations of the state of the art and to provide a simple method and system for generating an analog Gaussian noise signal that allows a user to determine the mean and the standard deviation of its PDF.

SUMMARY OF THE INVENTION

It is, therefore, an object of the invention to provide a method and system for generating an analog Gaussian noise signal that allows a user to determine the mean and the standard deviation of its PDF.

It is further an object of the invention to provide a method and system for generating an analog Gaussian noise signal resulting in an analog Gaussian noise source having low-complexity.

It is yet further an object of the invention to provide a method and system for generating an analog Gaussian noise signal resulting in an analog Gaussian noise source that is substantially robust.

In accordance with the present invention there is provided a method for generating an analog Gaussian noise signal comprising:

providing one of a pulse-density modulated 1-bit sequence and a pulse-density modulated multi-bit sequence representing a Gaussian noise signal having a predetermined probability distribution function, bandwidth and center frequency; and, processing the one of a pulse-density modulated 1-bit sequence and a pulse-density modulated multi-bit sequence to generate a corresponding analog Gaussian noise signal having a predetermined probability distribution function, bandwidth and center frequency.

In accordance with the present invention there is further provided a method for generating an analog Gaussian noise signal comprising: providing a predetermined sequence of symbols, the predetermined sequence of symbols approximating a Gaussian noise signal having a predetermined probability distribution function, bandwidth and center frequency; and, processing the predetermined sequence of symbols to generate a corresponding analog Gaussian noise signal having a predetermined probability distribution function, bandwidth and center frequency.

In accordance with the present invention there is yet further provided a method for generating an analog Gaussian noise signal comprising:

receiving control data indicative of a predetermined probability distribution function, bandwidth, and center frequency of a Gaussian noise signal;

generating in dependence upon the received control data a sequence of symbols approximating the Gaussian noise signal having the predetermined probability distribution function, bandwidth, and center frequency; and, processing the sequence of symbols to generate a corresponding analog Gaussian noise signal having a predetermined probability distribution function, bandwidth and center frequency.

In accordance with the present invention there is yet further provided a system for generating an analog Gaussian noise signal comprising:

source circuitry, in operation the source circuitry providing one of a pulse-density modulated 1-bit sequence and a pulse-density modulated multi-bit sequence representing a Gaussian noise signal having a predetermined probability distribution function, bandwidth and center frequency;

processing circuitry connected to the source circuitry, in operation the processing circuitry reducing high frequency components within the one of a pulse-density modulated 1-bit sequence and a pulse-density modulated multi-bit sequence to generate an analog Gaussian noise signal having the predetermined probability distribution function, bandwidth and center frequency; and, an output port connected to the digital-to-analog converter, in operation the output port providing the analog Gaussian noise signal having the predetermined probability distribution function, bandwidth and center frequency.

In accordance with the present invention there is yet further provided a storage medium having stored therein executable commands for execution on a processor, the processor when executing the commands generating one of a pulse-density modulated 1-bit sequence and a pulse-density modulated multi-bit sequence representing a Gaussian noise signal having a predetermined probability distribution function, bandwidth and center frequency.

In accordance with the present invention there is yet further provided a system for generating an analog Gaussian noise signal comprising:

source circuitry, in operation the source circuitry providing a predetermined sequence of symbols, the predetermined sequence of symbols approximating a Gaussian noise signal having a predetermined probability distribution function, bandwidth and center frequency; and, processing circuitry connected to the source circuitry, in operation the processing circuitry reducing high frequency components within the predetermined sequence of symbols to generate a corresponding analog Gaussian noise signal having a predetermined probability distribution function, bandwidth and center frequency.

In accordance with the present invention there is yet further provided a system for generating an analog Gaussian noise signal comprising:

control circuitry for receiving control data indicative of a predetermined probability distribution function, bandwidth, and center frequency of a Gaussian noise signal;

source circuitry connected to the control circuitry, in operation the source circuitry generating in dependence upon the received control data a sequence of symbols approximating the Gaussian noise signal having the predetermined probability distribution function, bandwidth, and center frequency; and, processing circuitry connected to the source circuitry, in operation the processing circuitry processing the sequence of symbols to generate a corresponding analog Gaussian noise signal having a predetermined probability distribution function, bandwidth and center frequency.

In accordance with the present invention there is yet further provided a method for histogram testing of a device under test comprising:

providing an analog Gaussian noise signal having a predetermined probability distribution function, bandwidth and center frequency to the device under test;

capturing at each output level of the device under test output samples;

tabulating for each output level the output samples; and, determining for each output level a probability distribution function in dependence upon the tabulated output samples.

In accordance with the present invention there is yet further provided a system for histogram testing of a device under test comprising:

a Gaussian noise source, in operation the Gaussian noise source being connected to the analog-to-digital converter to provide an analog Gaussian noise signal having a predetermined probability distribution function, bandwidth and center frequency thereto;

test circuitry, in operation the test circuitry being connected to at least an output port of the device under test to:
  capture output samples produced by the analog-to-digital converter;
  tabulate the output samples; and,
  determine at least a probability distribution function.

In accordance with the present invention there is yet further provided a method for probabilistic digitization of a voltage signal comprising:

a.) providing an analog Gaussian noise signal having a predetermined probability distribution function, bandwidth and center frequency;

b) receiving the voltage signal;

c) sampling and comparing the Gaussian noise signal with the voltage signal;

d) counting instances where a voltage level of the Gaussian noise signal is less than the corresponding voltage level of the voltage signal;

e) repeating a) to d) until a predetermined number of samples have been collected;

f) determining a probability of the instances where the voltage level of the Gaussian noise signal is less than the corresponding voltage level of the voltage signal; and, g) determining digital data indicative of the voltage level of the voltage signal in dependence upon the probability of the instances where the voltage level of the Gaussian noise signal is less than the corresponding voltage level of the voltage signal and a mean and standard deviation of the predetermined probability distribution function of the analog Gaussian noise signal.

In accordance with an embodiment the method comprises resetting a mean of the predetermined probability distribution function;

resetting a standard deviation of the predetermined probability distribution function; and, repeating a) to g).

In accordance with an embodiment the mean is reset to the voltage level of the voltage signal determined in g).

In accordance with an embodiment the standard deviation is reset in dependence upon the voltage level of the voltage signal determined in g).

In accordance with an embodiment the method comprises:

providing one of a pulse-density modulated 1-bit sequence and a pulse-density modulated multi-bit sequence representing a Gaussian noise signal having the predetermined probability distribution function, bandwidth and center frequency; and, using a digital-to-analog converter converting the one of a pulse-density modulated 1-bit sequence and a pulse-density modulated multi-bit sequence into the analog Gaussian noise signal having the predetermined probability distribution function.

In accordance with the present invention there is yet further provided a probabilistic digitizer for digitizing a voltage signal comprising:

a Gaussian noise source, in operation the Gaussian noise source providing an analog Gaussian noise signal having a predetermined probability distribution function, bandwidth and center frequency;

a comparator having a first input port connected to the Gaussian noise source, in operation the comparator:
  receiving the Gaussian noise signal at the first input port and the voltage signal at a second input port; and,
  sampling and comparing the Gaussian noise signal with the voltage signal;

output circuitry comprising a counter connected to an output port of the comparator, in operation the output circuitry:
  counting instances where a voltage level of the Gaussian noise signal is less than the corresponding voltage level of the voltage signal;
  determining a probability of the instances where the voltage level of the Gaussian noise signal is less than the corresponding voltage level of the voltage signal; and,
  determining digital data indicative of the voltage level of the voltage signal in dependence upon the probability of the instances where the voltage level of the Gaussian noise signal is less than the corresponding voltage level of the voltage signal and a mean and standard deviation of the predetermined probability distribution function of the analog Gaussian noise signal.

In accordance with an embodiment, the Gaussian noise source comprises:

digital source circuitry, in operation the digital source circuitry providing one of a pulse-density modulated 1-bit sequence and a pulse-density modulated multi-bit sequence representing a Gaussian noise signal having the predetermined probability distribution function, bandwidth and center frequency; and, a digital-to-analog converter connected to the source circuitry, in operation the digital-to-analog converter converting the one of a pulse-density modulated 1-bit sequence and a pulse-density modulated multi-bit sequence into a respective analog Gaussian noise signal having the predetermined probability distribution function, bandwidth and center frequency.

In accordance with the present invention there is yet further provided a method for generating a jitter signal comprising:
providing a signal to a delay buffer;
providing an analog Gaussian noise signal having a predetermined probability distribution function, bandwidth and center frequency to the delay buffer;
using the delay buffer processing the received signal in dependence upon the analog Gaussian noise signal for generating a jitter signal; and,
providing the jitter signal.

In accordance with an embodiment a clock signal is received at the delay buffer.

In accordance with an embodiment mapping the analog Gaussian noise signal into a time-delay is performed.

In accordance with an embodiment the mapping is performed in a substantially linear fashion.

In accordance with an embodiment the mapping is performed in a non-linear fashion.

In accordance with an embodiment the method comprises pre-distorting the analog Gaussian noise signal in a predetermined fashion to account for the non-linearity of the mapping.

In accordance with the present invention there is yet further provided a system for generating a jitter signal comprising:
an input port for receiving a signal;
a Gaussian noise source, in operation the Gaussian noise source providing an analog Gaussian noise signal having a predetermined probability distribution function, bandwidth and center frequency;
a delay buffer connected to the input port and the Gaussian noise source, in operation the delay buffer processing the received signal in dependence upon the analog Gaussian noise signal for generating a jitter signal; and,
an output port connected to the delay buffer for providing the jitter signal.

According to an embodiment the delay buffer is a voltage controlled delay buffer.

According to an embodiment the system comprises a reference clock connected to the input port, in operation the reference clock providing a clock signal.

BRIEF DESCRIPTION OF THE DRAWINGS

Exemplary embodiments of the invention will now be described in conjunction with the following drawings, in which:

FIG. 19b is a diagram illustrating the PDF of the analog Gaussian noise signal used in the system shown in FIG. 19a;

FIG. 21b is a circuit diagram of a voltage-controlled delay buffer used in the programmable jitter source shown in FIG. 21a;

DETAILED DESCRIPTION OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

For the sake of clarity and to provide a better understanding of the invention, a brief overview of the state of the art in Gaussian noise generation will be presented in the following.

Figure 1:
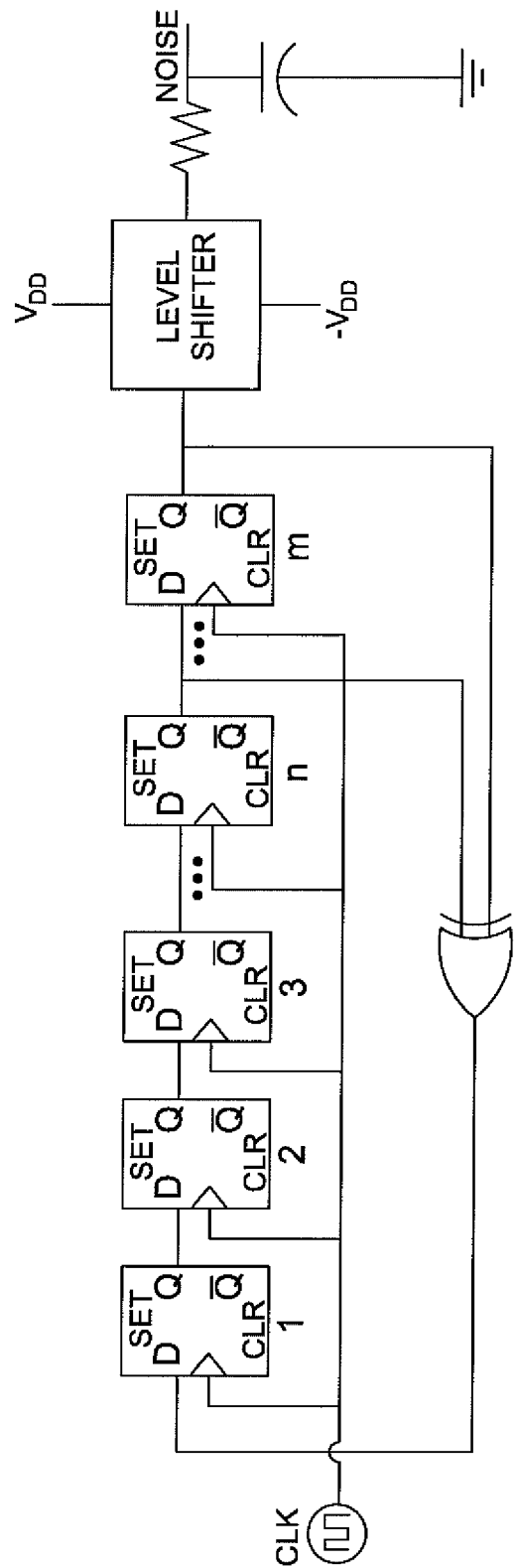
FIG. 1 is a simplified block diagram illustrating a prior art pseudo-random noise source.

Linear Feedback Shift Registers (LFSRs) are commonly used to generate a sequence of bits. A single two-input exclusive-OR gate is the only hardware component needed to enable a shift register to generate—by successive shifts—all of its possible non-zero values. Applications of LFSRs include: error-correcting codes, pseudo-random sequence generation for ranging and synchronization, test pattern generation and signature analysis in Very Large Scale Integration (VLSI) circuits, and programming counters in simple computers. The LFSR has also been employed as a pseudo-random noise source producing a pseudo-random bit stream (PRBS), as shown in FIG. 1. To eliminate a DC offset of the LFSR and hence to obtain a mean of 0 V, a DC level shifter with a voltage swing between $V_{DD}$ and $-V_{DD}$ that maps the high digital values to $V_{DD}$ and the low digital values to $-V_{DD}$ is used. A RC low-pass filter connected to the output side of the DC level shifter is then used to generate the analog noise signal for a preset frequency band. The rms noise voltage per square root hertz is expressed as:

$$\frac{V_{rms}}{\text{Hz}^{1/2}} = V_{DD}\left(\frac{2}{f_{clk}}\right)^{1/2} \text{V/Hz}^{1/2}, f \le 0.2 f_{clk}. \tag{1}$$

In order to obtain the rms value of the noise, equation (1) is multiplied by the square root of the noise bandwidth. If a RC low-pass filter is used the noise bandwidth is:

$$B = \frac{\pi}{2} f_{3\,dB}. \tag{2}$$

After combining equations (1) and (2) and rearranging terms the following expression for the rms noise voltage is found:

$$V_{rms} = V_{DD}\left(\frac{\pi f_{3\,dB}}{f_{clk}}\right)^{1/2}. \tag{3}$$

Figure 2A:
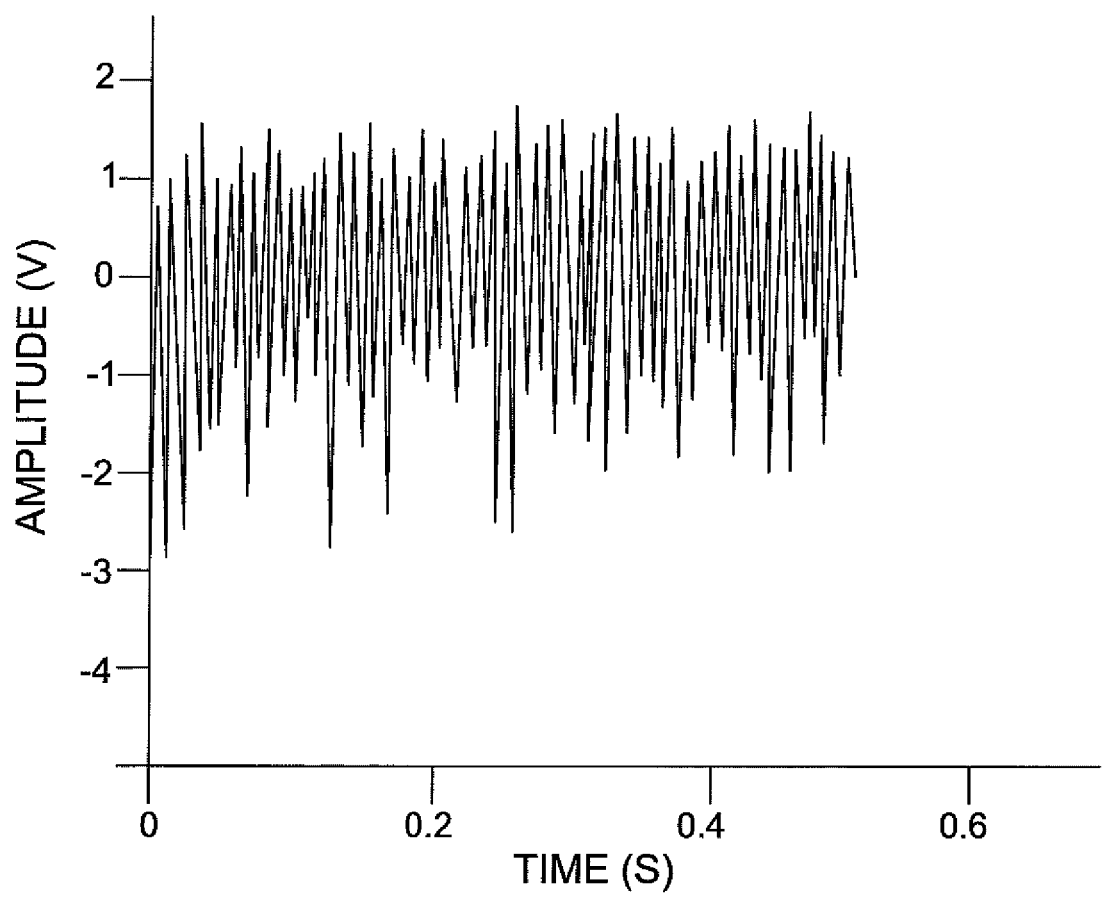
FIGS. 2a and 2b are diagrams illustrating a noise signal and its histogram, respectively, produced by the prior art pseudo-random noise source shown in FIG. 1.
Figure 2B:
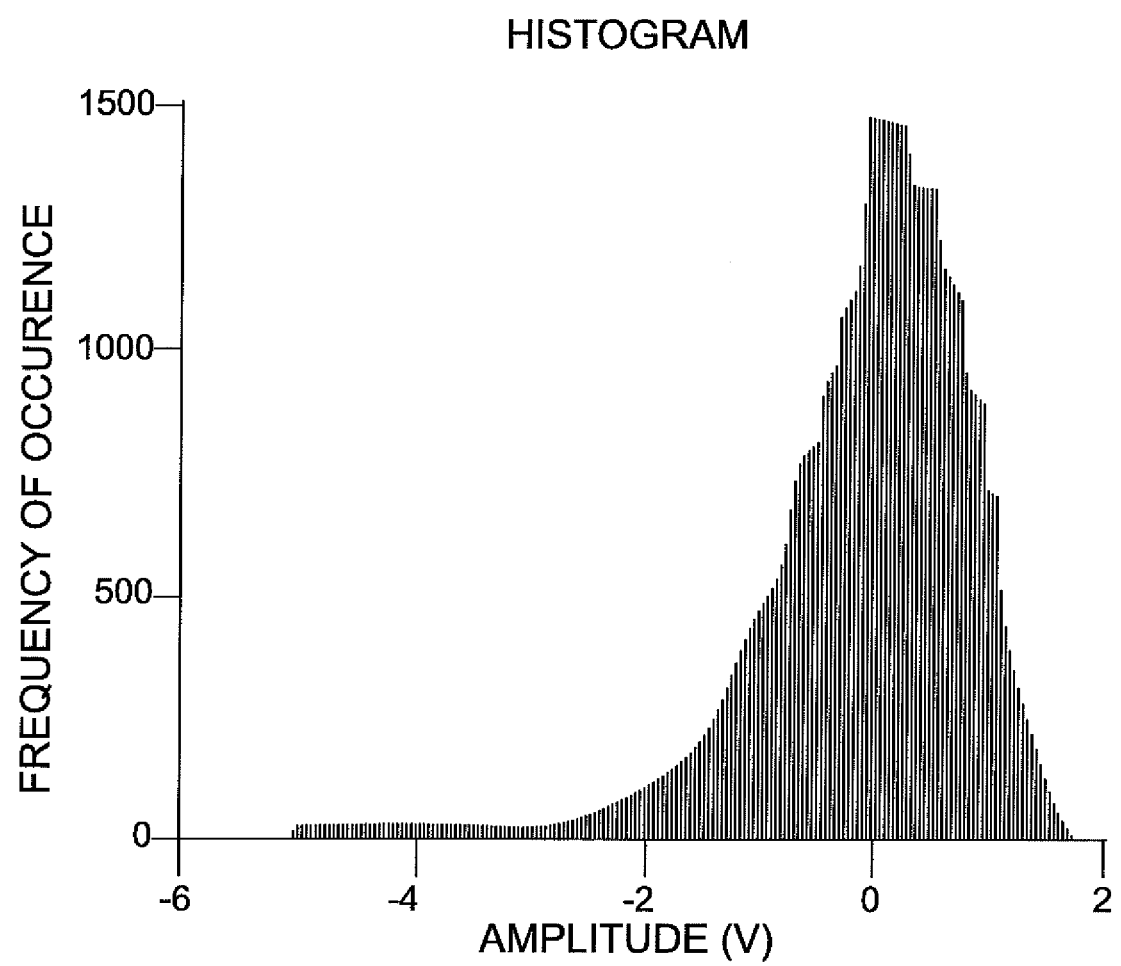

FIGS. 2a and 2b illustrate a noise signal generated using the LFSR and its histogram, respectively. As depicted in FIG. 2b, the main disadvantage of this technique is that the generated noise signal has a substantial deviation from a Gaussian PDF. Furthermore, this technique does not allow a user to predetermine the mean and the standard deviation of the noise signal.

Figure 3:
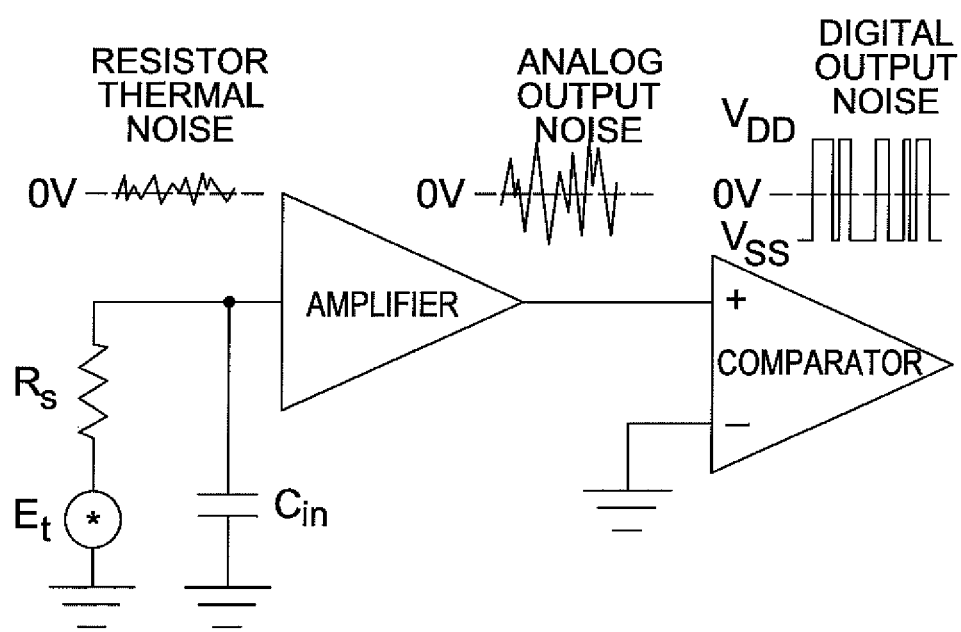
FIG. 3 is a simplified block diagram illustrating a prior art circuit for generating Gaussian noise by amplifying thermal noise of a resistor having a large resistance.

Referring to FIG. 3, a circuit for generating Gaussian noise by amplifying thermal noise of a resistor $R_s$ having a large resistance using an op-amp in a high-gain closed-loop configuration is shown. The resistor $R_s$ produces thermal noise which is then amplified. Input capacitance $C_{in}$ of the amplifier in conjunction with the resistor $R_s$ act as a low-pass filter that limits the noise bandwidth and power. In case a digital random sequence of bits is desired, a comparator having its reference voltage set to the mean of the analog noise signal—0 V—provides a random binary output sequence. Although the random movement of electrons in a resistor produces a noise signal having an accurate Gaussian PDF, other effects such as 1/f noise adversely affect the Gaussian PDF. Furthermore, this circuit is highly susceptible to process variations as deviations in the resistance, or in the gain and offset of the op-amp alter the mean and the standard deviation of the Gaussian PDF. Once the circuit is manufactured, a user has no control over the Gaussian PDF.

The method and system for generating an analog Gaussian noise signal according to the invention uses $\Sigma\Delta$ modulation and exploits its noise shaping characteristic. To synthesize a periodic analog signal, for example, a sinusoid, a sequence of digital bits is repeated as to approximate the output signal of a 1-bit $\Sigma\Delta$ modulator when driven by a periodic signal and then filtered using an appropriate analog low-pass filter. As described in M. Hafed and G. W. Roberts: "*Test and Evaluation of Multiple Embedded Mixed-Signal Test Cores*", IEEE ITC, 2002, pp. 1022-1030, the process comprises simulating a high-order noise-shaping modulator and collecting a finite number of output samples. A periodic repetition of this sequence approximates the output bit sequence of an infinite-duration $\Sigma\Delta$ modulator. In order to obtain a periodic waveform, the output bit sequence is periodic with a period of $N/F_s$, where N is the length of the sequence and $F_S$ is the sampling frequency. Thus, the input signal to the $\Sigma\Delta$ modulator is harmonically related to the fundamental frequency of the output bit sequence, i.e. $F_S/N$. Since the approximate output bit sequence of the $\Sigma\Delta$ modulator is forced to be periodic, it implies that the encoded signal contains only a finite number of frequencies:

$$F_{out} = \frac{M}{N} F_S, M = 0, 1, 2, \ldots, N/2. \tag{4}$$

Figure 4:
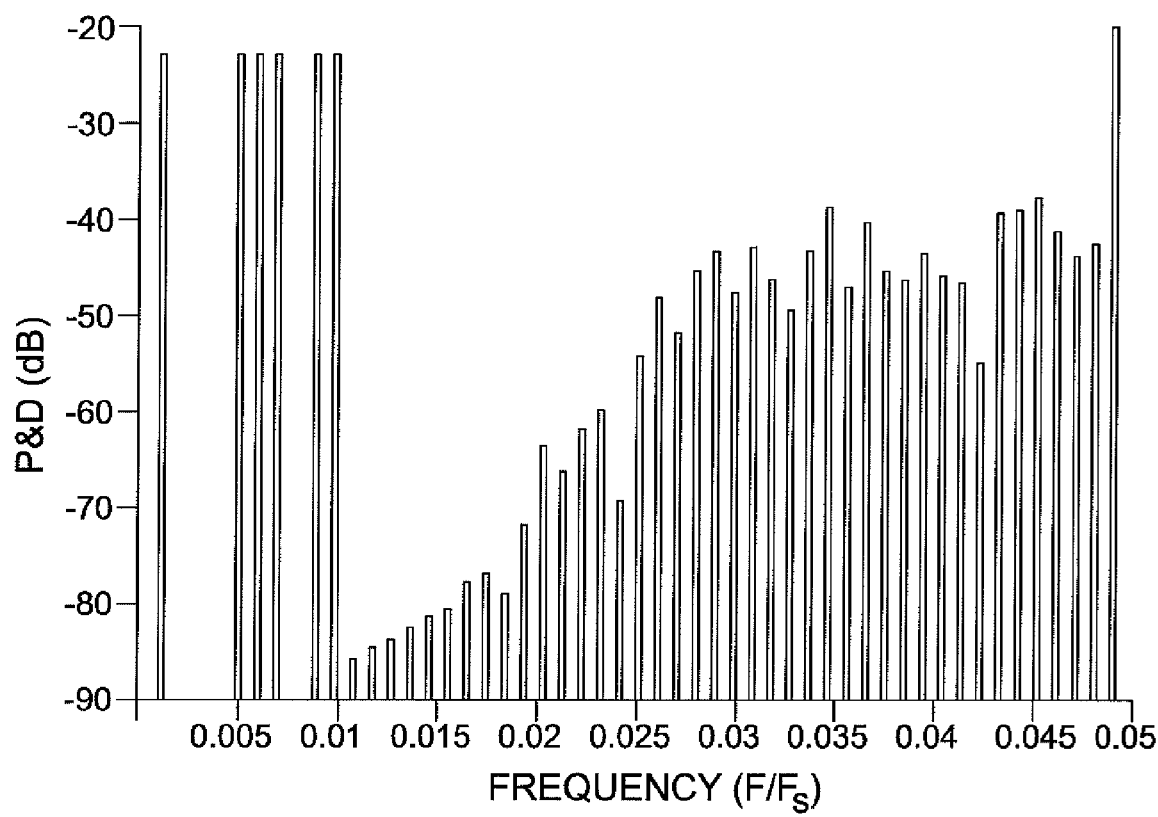
FIG. 4 is a diagram illustrating a spectrum of a periodically repeated sequence of a $\Sigma\Delta$ modulated bit stream.

FIG. 4 shows a typical spectrum of a periodically repeated sequence of a $\Sigma\Delta$ modulated bit stream. As a consequence of the noise shaping nature of pulse density modulation, as long as the encoded signal has a small enough bandwidth it will have low distortion harmonics when filtered using a properly tuned low-pass filter.

Figure 5:
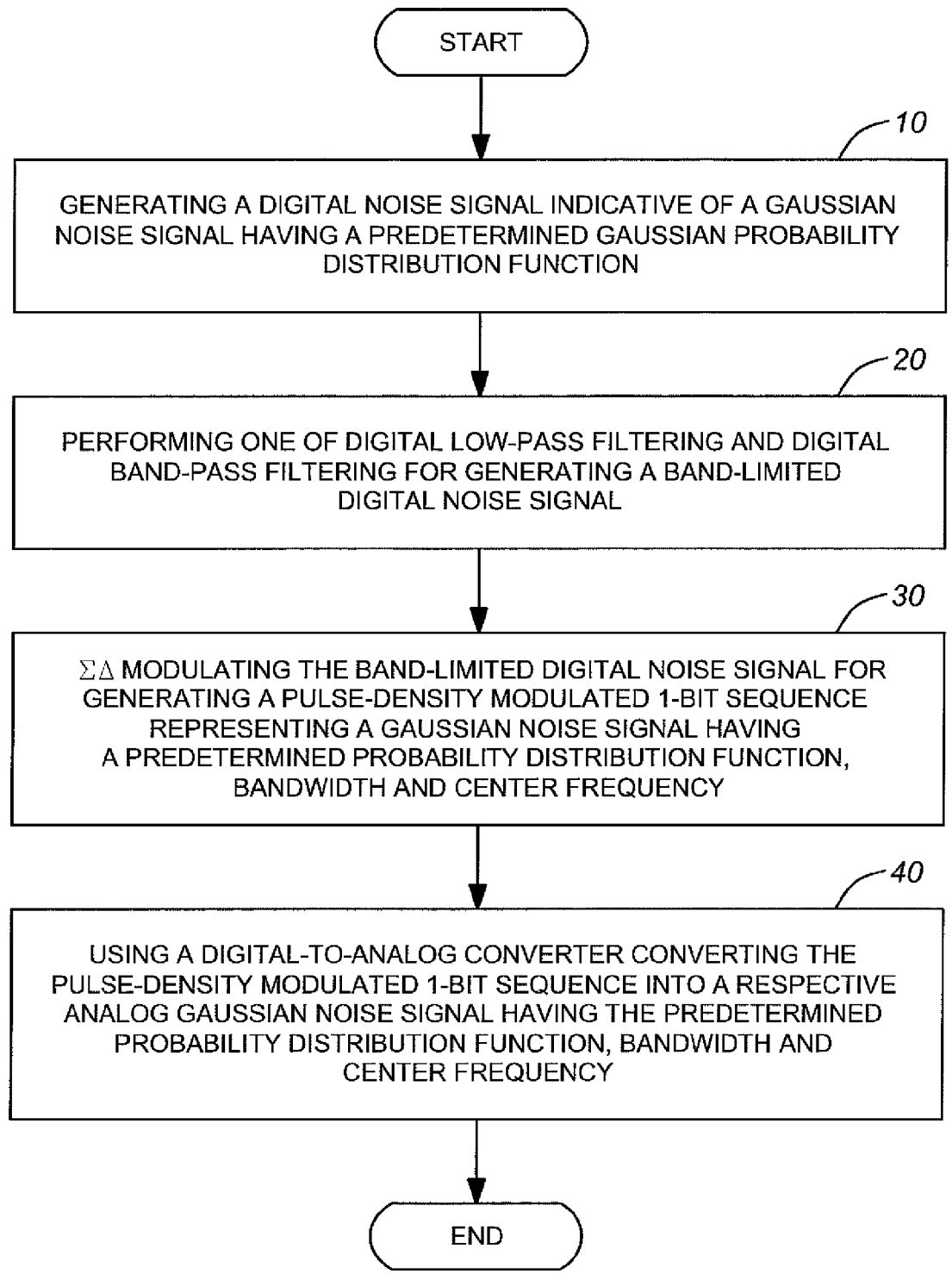
FIG. 5 is a simplified flow diagram of a first embodiment of a method for generating an analog Gaussian noise signal according to the invention.

Referring to FIG. 5, a simplified flow diagram of a method for generating an analog Gaussian noise signal according to the invention is shown. At 10, using a Gaussian noise source a digital noise signal indicative of a Gaussian noise signal having a predetermined Gaussian PDF—mean $\mu$ and standard deviation $\sigma$—is generated. For example, the digital noise signal is a bit stream representing a pulse-density encoded noise signal. To ensure proper operation of the $\Sigma\Delta$ modulator a sampling rate of the noise signal sampled is chosen that is substantially greater than the Nyquist rate of the sampled noise signal. In order to use the $\Sigma\Delta$ modulator the digital noise signal provided to the $\Sigma\Delta$ modulator is processed such that it has a finite bandwidth. Consequently, to obtain a pulse-density modulated bit sequence representing a Gaussian noise signal having a predetermined PDF, bandwidth and center frequency, care is taken that it is band-limited. Therefore, the digital noise signal is low-pass filtered—at 20—using a digital low pass filter, for example, a Chebychev type digital filter of high order, prior processing using the $\Sigma\Delta$ modulator—at 30. Alternatively, a band-pass filter is employed at 20, depending on the application. The $\Sigma\Delta$ modulator then generates the pulse-density modulated 1-bit sequence representing a Gaussian noise signal having a predetermined PDF, bandwidth and center frequency. At 40, the pulse-density modulated 1-bit sequence provided by the $\Sigma\Delta$ modulator is processed to generate an analog signal representing the Gaussian noise signal having a predetermined PDF, bandwidth and center frequency using, for example, an analog low-pass filter. The pulse-density modulated 1-bit sequence is processed to reduce high frequency components using, for example, a Digital-to-Analog Converter (DAC) or in its simplest form an analog low-pass filter.

Figure 6:
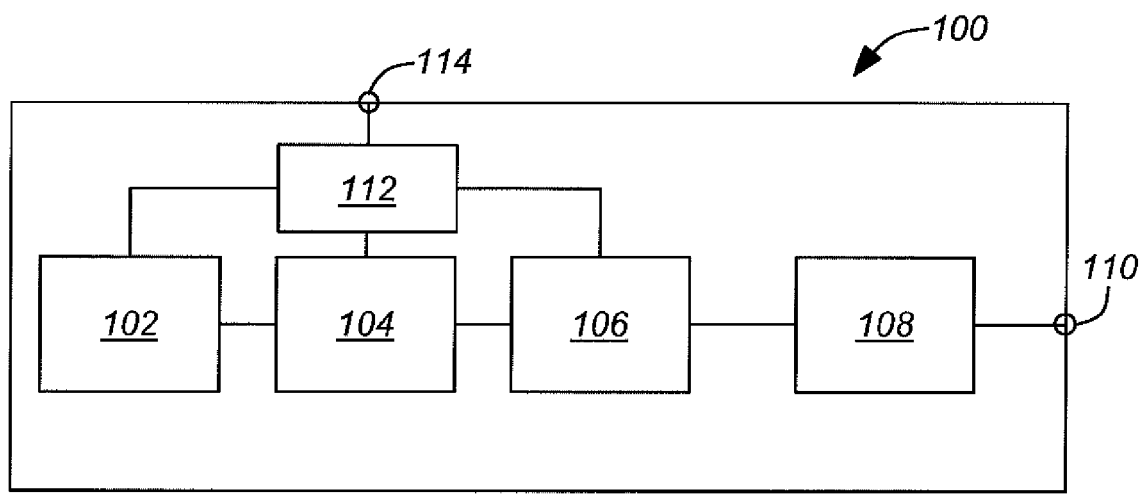
FIG. 6 is a simplified block diagram of a system for generating an analog Gaussian noise signal according to the invention.

Referring to FIG. 6, a simplified block diagram of a system 100 for generating an analog Gaussian noise signal according to the invention is shown. The system 100 comprises as main components: a Gaussian noise source 102 for generating a digital noise signal indicative of a Gaussian noise signal having a predetermined Gaussian PDF—mean $\mu$ and standard deviation; a digital low-pass filter 104 connected to the Gaussian noise source 102 for processing the digital noise signal in order to band-limit the same; a $\Sigma\Delta$ modulator 106 connected to the digital low-pass 104 for generating a pulse-density modulated 1-bit sequence representing a Gaussian noise signal having a predetermined PDF, bandwidth and center frequency in dependence upon the band-limited digital noise signal; and circuitry 108 for reducing high frequency components within the pulse-density modulated 1-bit sequence connected to the $\Sigma\Delta$ modulator 106 and to output port 110 for generating an analog signal representing the Gaussian noise signal having a predetermined PDF, bandwidth and center frequency. Alternatively, the digital low-pass filter 104 is replaced by a digital band-pass filter, depending on the application. As is evident to those skilled in the art, there are numerous possibilities for implementing the main components 102, 104, and 106 using digital electronic circuitry. For example, these components are implemented on a single semiconductor chip or a Field Programmable Gate Array (FPGA). A simple implementation of the circuitry 108 is an analog low-pass filter having a predetermined cutoff frequency. Alternatively, a DAC is used for generating the analog signal. For example, the digital low-pass filter 104 and the analog low-pass filter have a same cutoff frequency. In its simplest form, the analog low-pass filter comprises a RC circuit. Optionally, the system 100 comprises control circuitry 112 connected to the main components 102, 104, and 106 and an input port 114 connected to the control circuitry. In operation, the control circuitry controls the main components 102, 104, and 106 in dependence upon control signals received at the input port 114 for controllably providing an analog Gaussian noise signal having a predetermined PDF, bandwidth and center frequency in dependence upon the received control signals.

Figure 7:
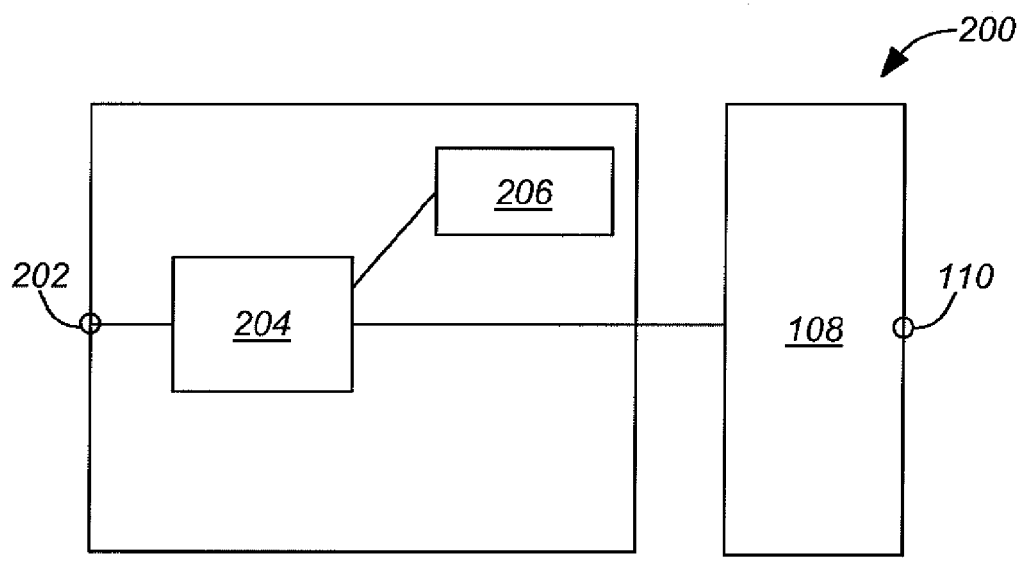
FIG. 7 is a simplified block diagram of the system for generating an analog Gaussian noise signal according to the invention.

Referring to FIG. 7, a simplified block diagram of a system 200 for generating an analog Gaussian noise signal according to the invention is shown. Here, the digital electronic circuitry comprising the components 102, 104 and 106 is replaced by a processor 204 for executing executable commands stored in memory 206. In operation, the processor 204 executes the commands stored in the memory 206 in dependence upon at least a control signal received from input port 202. When executing the executable commands the processor 204 performs the steps 10 to 30 of the method outlined above and provides a pulse-density modulated 1-bit sequence representing a Gaussian noise signal having a predetermined PDF, bandwidth and center frequency to circuitry 108 for generating a corresponding analog Gaussian noise signal. For example, the system 200 is implemented using a workstation and off-the-shelf software such as MATLAB/SIMULINK™, as will be described below.

Figure 8:
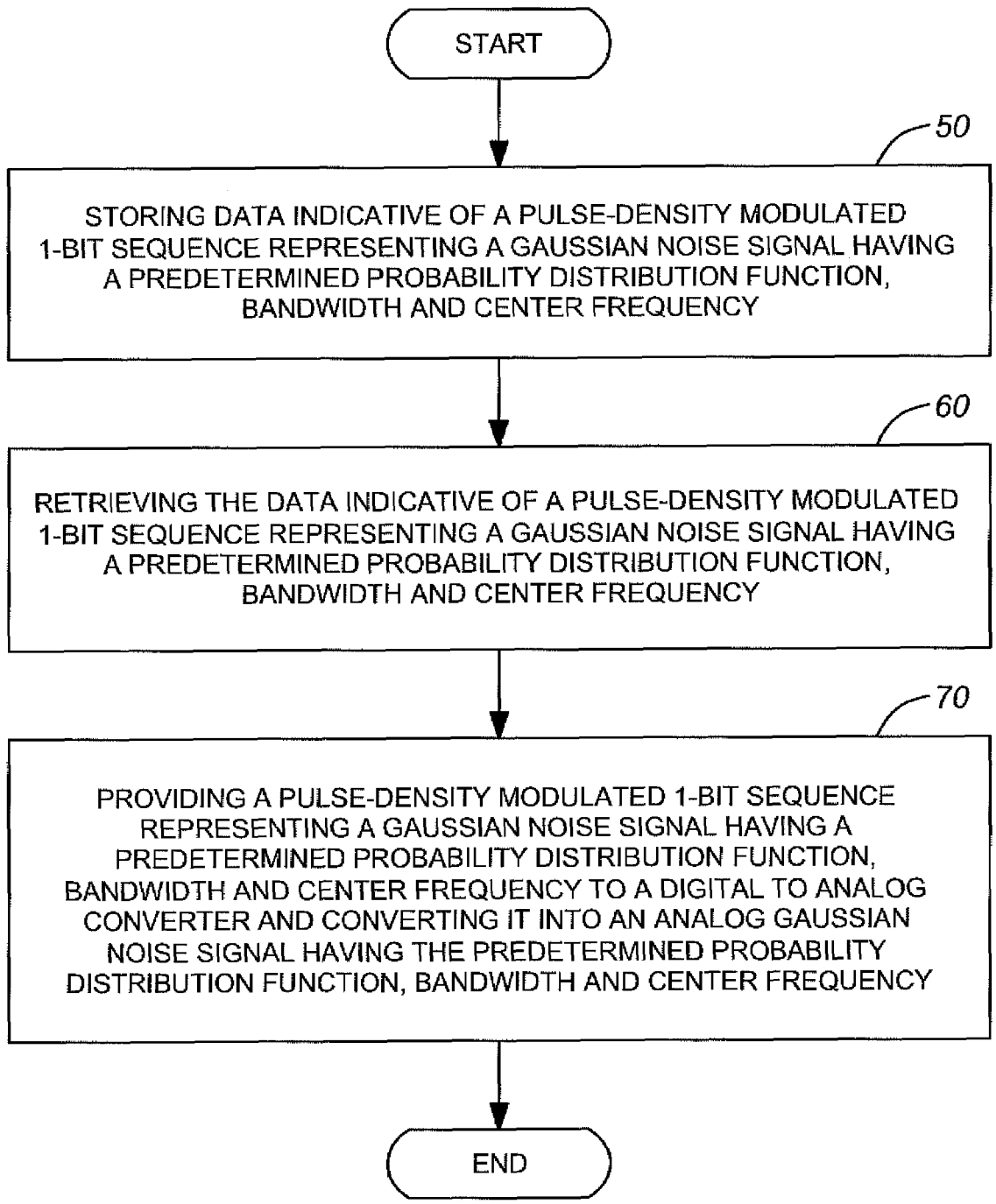
FIG. 8 is a simplified flow diagram of the method for generating an analog Gaussian noise signal according to the invention.

Referring to FIG. 8, a simplified flow diagram of a method for generating an analog Gaussian noise signal according to the invention is shown. Here, data indicative of a pulse-density modulated 1-bit sequence representing a Gaussian noise signal having a predetermined PDF, bandwidth and center frequency are stored in memory—at 50. In dependence upon a received control signal the data are retrieved—at 60—and the pulse-density modulated 1-bit sequence is processed—at 70—to generate an analog signal representing the Gaussian noise signal having a predetermined PDF, bandwidth and center frequency.

Figure 9:
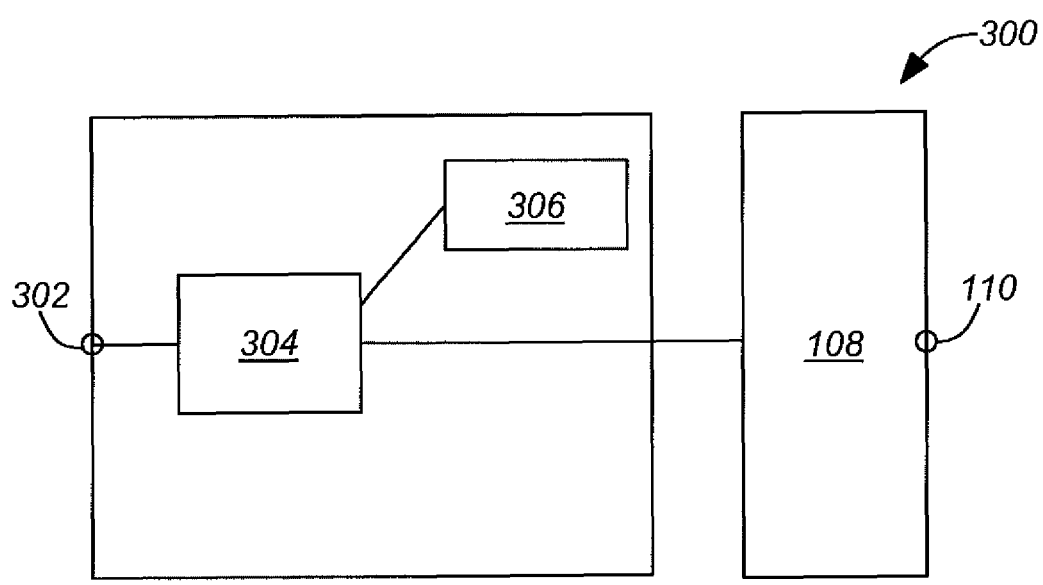
FIG. 9 is a simplified block diagram of the system for generating an analog Gaussian noise signal according to the invention.

Referring to FIG. 9, a simplified block diagram of a system 300 for generating an analog Gaussian noise signal according to the invention is shown. Here, the digital electronic circuitry of the components 102, 104 and 106 is replaced by a control circuitry 304 connected to DAC 108 and memory 306, the memory 306 having stored therein data indicative of a pulse-density modulated 1-bit sequence representing a Gaussian noise signal having a predetermined PDF, bandwidth and center frequency. In operation, in dependence upon a control signal received at input port 302 the control circuitry 304 retrieves the data from the memory and provides the pulse-density modulated 1-bit sequence to the circuitry 108 for generating an analog signal representing the Gaussian noise signal having a predetermined PDF, bandwidth and center frequency which is then provided via output port 110. Optionally, the memory 306 has stored therein data indicative of a plurality of pulse-density modulated 1-bit sequences representing Gaussian noise signals having different predetermined PDF, bandwidth and center frequency which are controllably selected by the control circuitry 304 in dependence upon the control signal.

As described above, the system 200 for generating an analog Gaussian noise signal according to the invention has been implemented using MATLAB/SIMULINK™. For a simulation, in order to comply with a 3.3 V hardware implementation described below, the upper voltage $V_{DD}$ and the lower voltage $V_{SS}$ are set to 1.65 V and −1.65 V, respectively. To ensure that smaller values of the Gaussian PDF are properly represented, the standard deviation covers a range approximately $5\sigma$ from the mean $\mu$ in either direction. Hence, the standard deviation is set to 0.30 V. It is noted that the digital noise signal produced by the white Gaussian noise source has a higher standard deviation in order to compensate for energy lost when the signal is low-pass filtered.

The digital low-pass filter used to band-limit the digital noise signal produced by the white Gaussian noise source is a Chebyshev type 2 digital filter of high order with a 3-dB cutoff frequency $F_{Pass}$ of 1.95 kHz. It is noted that it is possible to use numerous other types of digital low-pass or band-pass filters. In this case, the Chebyshev type 2 digital filter is used because such a filter has a flat magnitude response in the pass band.

The $\Sigma\Delta$ modulator used to digitally encode the band-limited digital noise signal is a basic $2^{nd}$ order modulator having a sampling frequency $F_S$ of 500 kHz; thus giving an Over-Sampling Rate (OSR) of 128. The generated pulse-density modulated bit sequence maps the high pulses to 1.65 V and the low pulses to −1.65 V to ensure that the mean $\mu$ of the Gaussian PDF is 0 V.

The analog filter to convert the digital bit sequence into an analog signal representing the Gaussian noise signal is built in a hardware fashion. Therefore, in order to investigate its robustness a first order low-pass filter is used in the simulation. As for the digital low-pass filter the 3-dB cutoff frequency $F_{Pass}$ of the analog low-pass filter is also set to 1.95 kHz. The following table 1 summarizes the parameters used in the simulation.

TABLE 1

| Block | Parameter | Value |
|---|---|---|
| White Noise Source | $\mu$ | 0 V |
| | $\sigma$ | 3.82 V |
| Digital Filter | Type | Chebyshev Type 2 |
| | $F_S$ | 500 kHz |
| | $F_{Pass}$ | 1.95 kHz |
| $\Sigma\Delta$ Modulator | Order | 2 |
| | $F_S$ | 500 kHz |
| Analog Filter | Order | 1 |
| | $F_{Pass}$ | 1.95 kHz |

Figure 10:
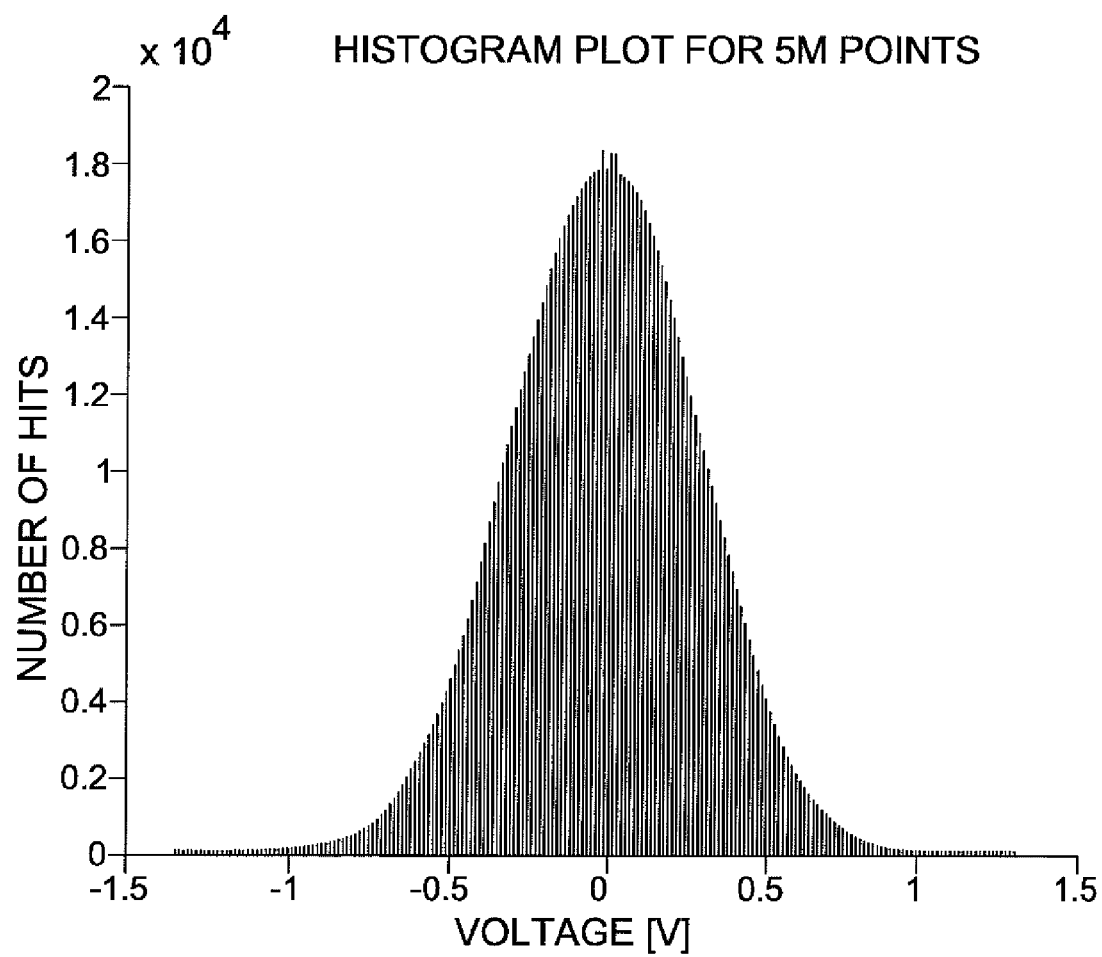
FIG. 10 is a diagram illustrating a histogram plot of an analog Gaussian noise signal produced using the system for generating an analog Gaussian noise signal according to the invention.
Figure 11:
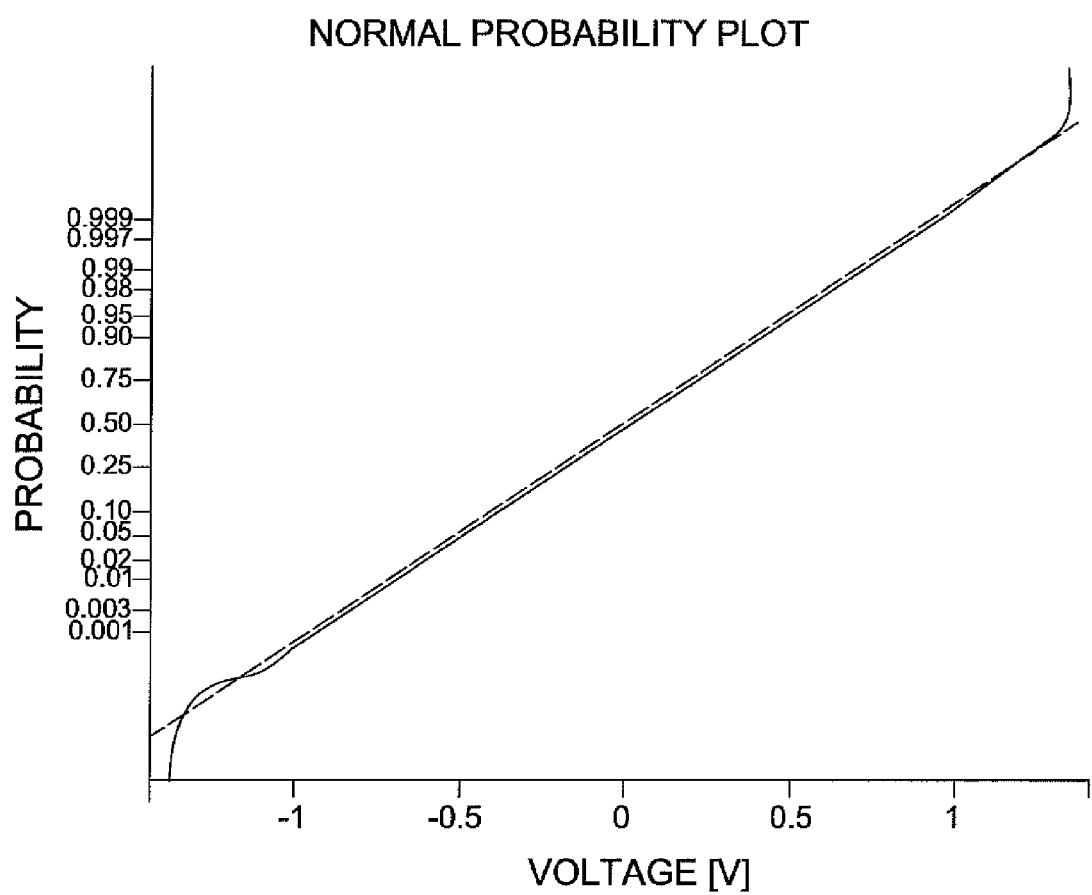
FIG. 11 is a diagram illustrating a normal probability plot of an analog Gaussian noise signal produced using the system for generating an analog Gaussian noise signal according to the invention.

Using the above simulation 5 million points have been captured. As shown in the histogram plot in FIG. 10, the PDF closely follows a Gaussian PDF. However, to further investigate the "quality" of the PDF, and in particular smaller values of the PDF, a normal probability plot is used, as shown in FIG. 11. This plot shows the cumulative probability versus the value of each point in the sample set. The scale of the y-axis is adjusted such that a perfect Gaussian PDF follows a straight line with the mean having a probability of 0.5. FIG. 11 shows that when 5 million points are taken, the PDF follows a normal between −1.3 V and 1.3 V, which is a distance of 4.33 $\sigma$ from the mean on either side. In the case where 10 million points are collected, the PDF is Gaussian up to a distance of approximately 5 $\sigma$ to the mean.

Figure 12:
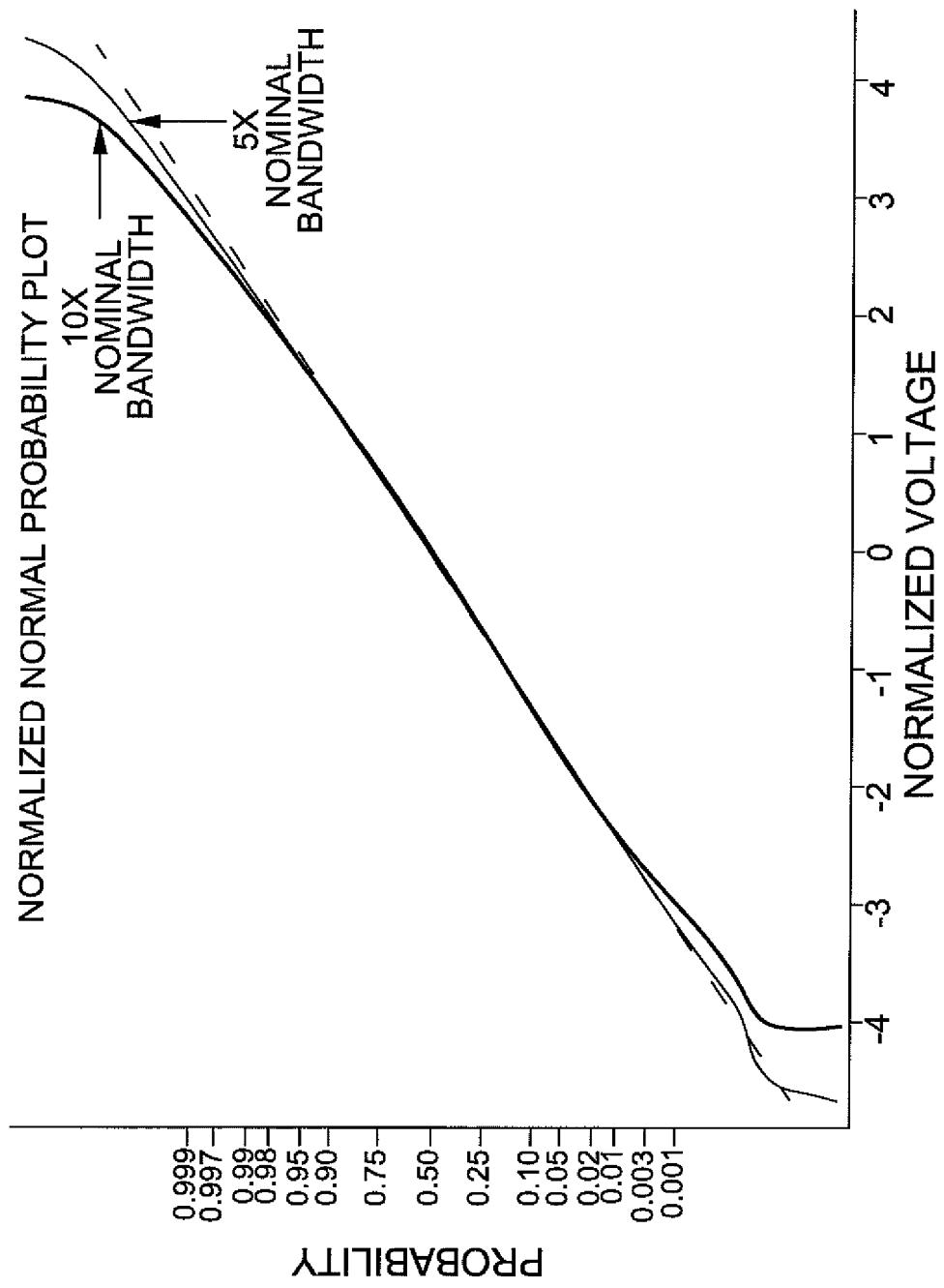
FIG. 12 is a diagram illustrating a normalized normal probability plot of analog Gaussian noise signals produced using the system for generating an analog Gaussian noise signal according to the invention with an analog filter having 5 and 10 times the nominal bandwidth.

In order to investigate the sensitivity of the method and system for generating an analog Gaussian noise signal according to the invention to the analog filtering process, the PDF has been analyzed using different filter bandwidths. It has been observed that as the cutoff frequency is increased, the standard deviation $\sigma$ also increases. This is no surprise as the wider the bandwidth the more quantization noise appears in the analog filter output signal. However, it has been observed that even though more quantization noise passes through the analog filter, the quality of the PDF does not degrade proportionally to the increase in filter bandwidth. For example, it has been noted that even if the bandwidth of the analog filter is five times the nominal, the PDF remains accurate to approximately 4 $\sigma$. In that case, the standard deviation $\sigma$ increased to 0.36 V but the quality of the smaller values of the PDF decreased since the PDF follows a Gaussian only up to 4.1 $\sigma$ on either side of the mean. As the filter bandwidth is further increased to ten times the nominal bandwidth, the distribution is accurate up to 3 $\sigma$. This is shown in the normalized normal probability plot in FIG. 12 for both cases: five times and ten times the nominal bandwidth, respectively. Both normal probability plots were normalized to a Gaussian PDF having a mean $\mu$ equal to 0 V and a standard deviation $\sigma$ equal to 1 V in order to obtain a clearer visual interpretation.

Figure 13:
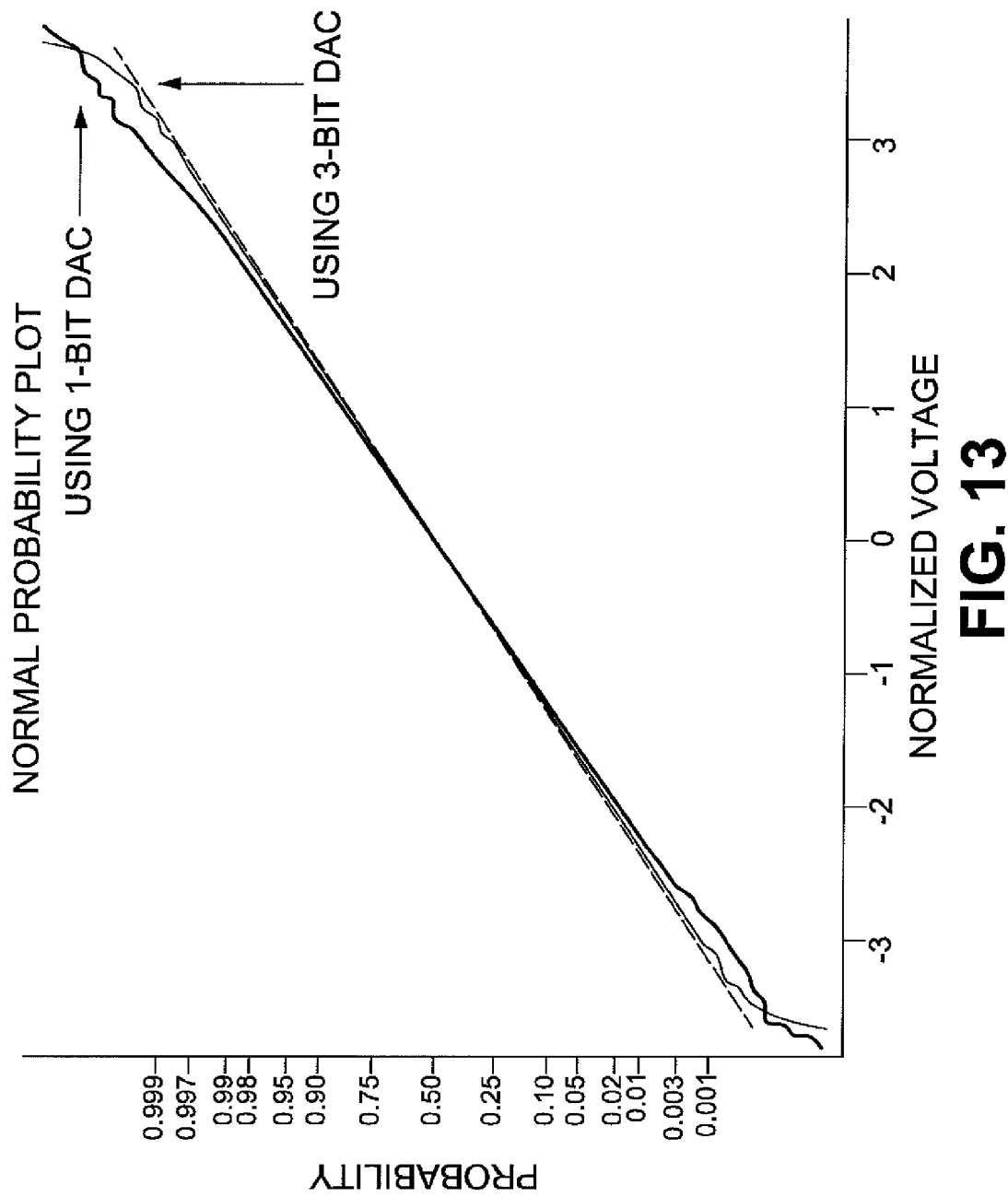
FIG. 13 is a diagram illustrating a normalized normal probability plot of analog Gaussian noise signals produced using the system for generating an analog Gaussian noise signal according to the invention with 1-bit and 3-bit DAC implementation.

In situations where a multi-bit DAC and memory are available such as in mixed-signal Automated Test Equipment (ATE), it is also possible to apply the method and system for generating an analog Gaussian noise signal according to the invention in a multi-bit fashion instead of a single bit fashion. In the case where a high OSR, for example, 128, and 1 million points are used, the PDF of the generated analog Gaussian noise signal has a high quality even for small standard deviations. In fact, given that the standard deviation $\sigma$ is set to 0.15 V, the PDF of the generated analog Gaussian noise signal is accurate to approximately 3.2 $\sigma$. However, when a smaller OSR is used and fewer points are collected the quality of the PDF of the generated analog Gaussian noise signal slowly degrades for small standard deviations. For example, when the OSR is set to 32 and 100,000 points are collected the quality of the PDF of the generated analog Gaussian noise signal is accurate only to approximately 2 $\sigma$, as shown in FIG. 13. When a 3-bit DAC is used instead, the quality of the PDF of the generated analog Gaussian noise signal is accurate to more than 3 $\sigma$. In other words, using a multi-bit DAC improves the quality of the PDF of the generated analog Gaussian noise signal when a small standard deviation is needed and a small memory is available. However, in most cases the employment of a multi-bit DAC does not provide an improvement in the quality of the PDF of the generated analog Gaussian noise signal that justifies the additional complexity and cost involved.

As will be disclosed in the following, it is possible to reduce the OSR and the number of points sampled to encode the Gaussian noise signal at the expense of robustness and quality of the PDF of the generated analog Gaussian noise signal. For example, when the OSR is reduced to 32 and 100,000 points are sampled for a standard deviation $\sigma$ of 0.3 V, the PDF of the generated analog Gaussian noise signal is accurate to approximately 4 $\sigma$. However, if the analog low-pass filter bandwidth is doubled, the PDF of the generated analog Gaussian noise signal is accurate to 2 $\sigma$. As discussed above, reducing the OR also decreases the quality of the PDF of the generated analog Gaussian noise signal for small standard deviations. In many cases, it is not necessary to generate an analog Gaussian noise signal having an accurate PDF to 4 $\sigma$, and hence it is possible to reduce the number of points sampled and consequently memory size. In fact, 95% of a Gaussian noise signal is within 2 $\sigma$ of its mean value. Using the parameters described in table 1 but for an OSR of 32 and a modulator order of 4, an analog Gaussian noise signal having an accurate PDF to 2 $\sigma$ is generated with only 2,500 points sampled, making it attractive for Built In Self Test (BIST) applications. Table 2 shows the number of points sampled to obtain an analog Gaussian noise signal having an accurate PDF to 2, 3, and 4 $\sigma$.

TABLE 2

| Number of Points | Quality in σ |
|---|---|
| 100,000 | 4 σ |
| 15,000 | 3 σ |
| 2,500 | 2 σ |

Figure 14:
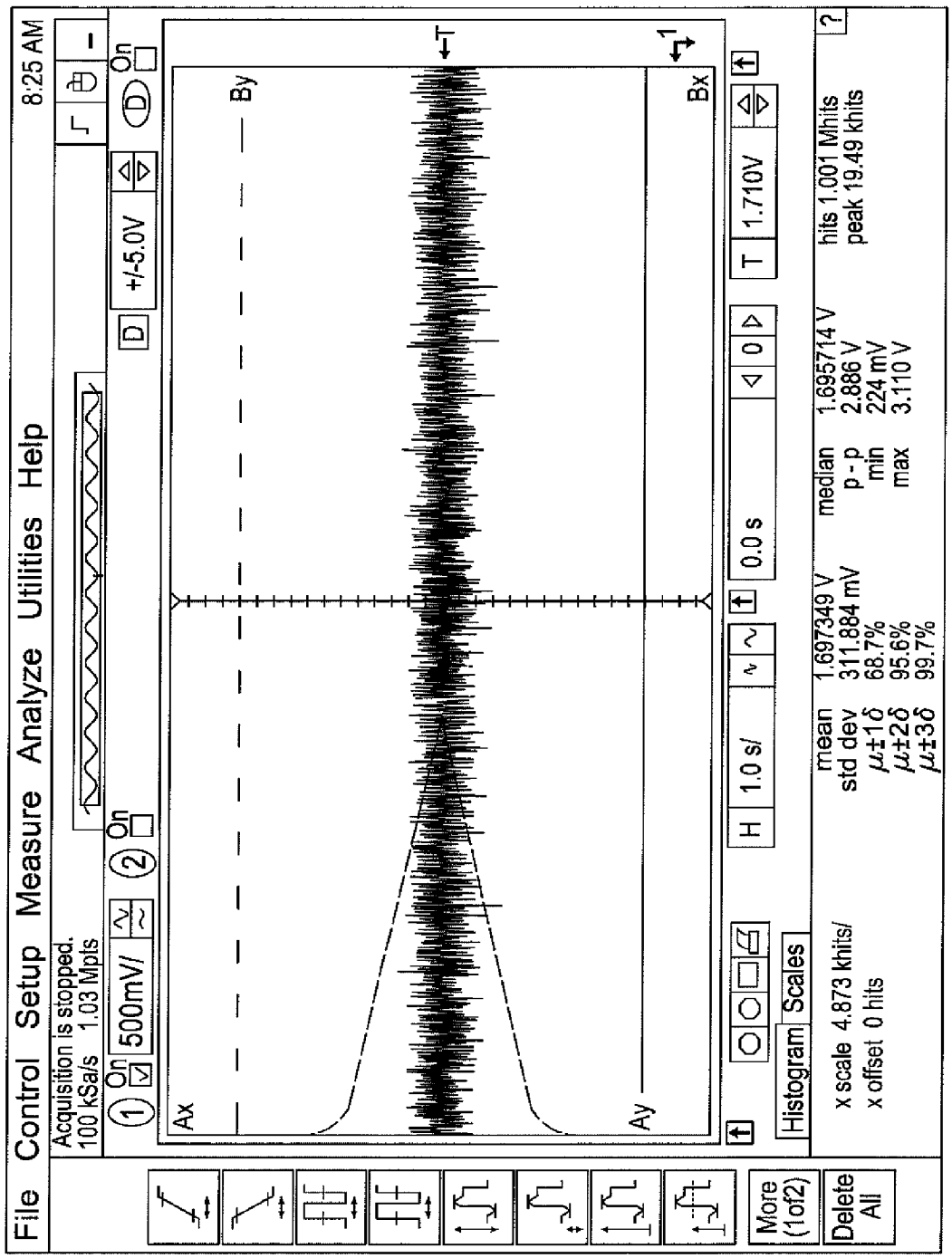
FIG. 14 is a diagram illustrating an analog Gaussian noise signal produced using the system for generating an analog Gaussian noise signal according to the invention and its histogram.
Figure 15:
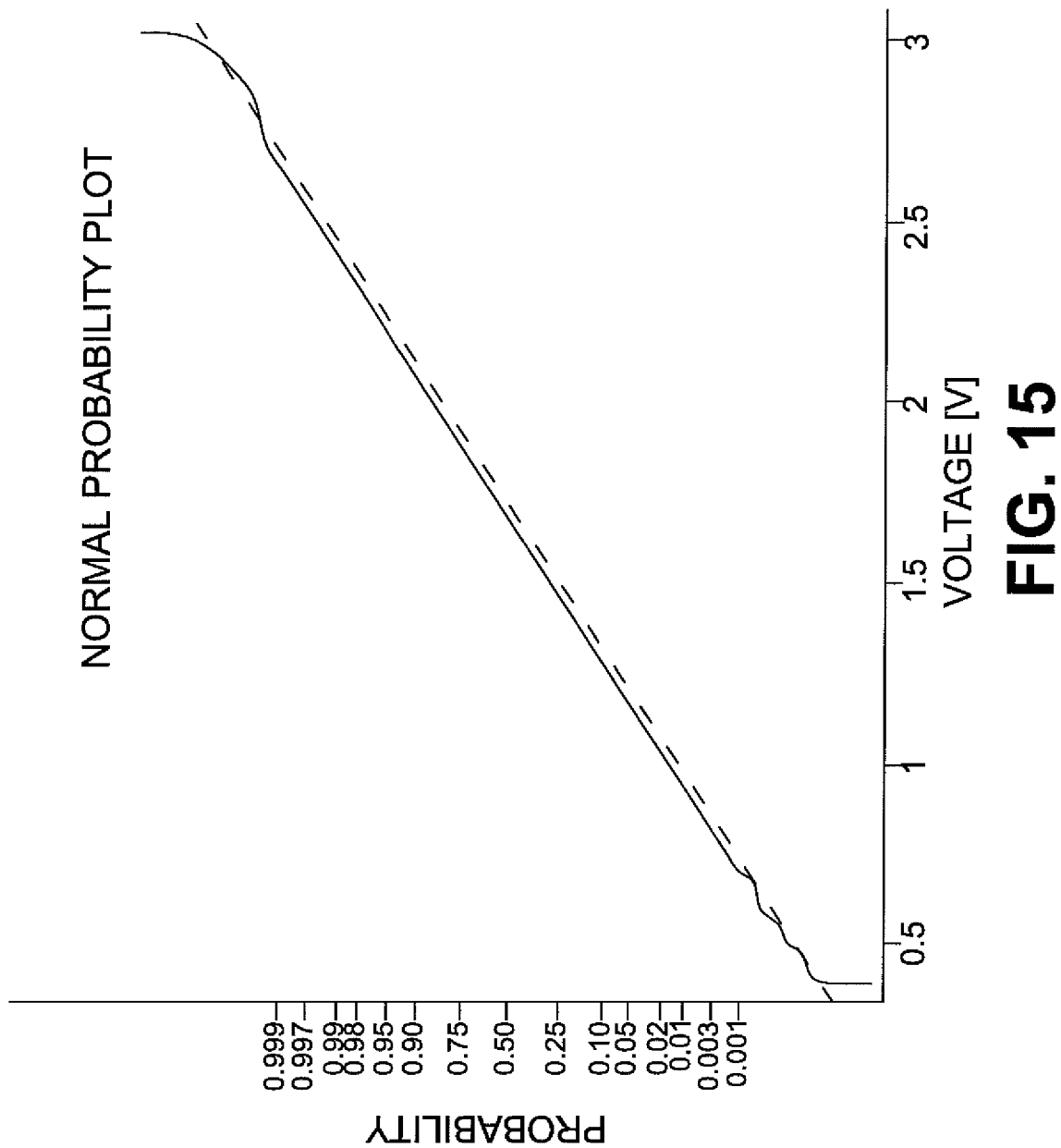
FIG. 15 is a diagram illustrating a normal probability plot of analog Gaussian noise signals produced using the system for generating an analog Gaussian noise signal according to the invention with a filter cutoff frequency of 1.95 kHz.

In a hardware implementation, MATLAB/SIMULINK™ is used to generate pulse-density modulated 1-bit sequence representing a Gaussian noise signal having a predetermined PDF, bandwidth and center frequency comprising 1.45 million bits that are then used to initialize a RAM block of a Stratix DSP S80 FPGA. It is noted that 1.45 million bits are used because this is the largest allowable size for the memory initialization file; however, this corresponds to 19% of the total memory resources of the FPGA. The 3.3 V Low Voltage Transistor-Transistor Logic (LVTTL) output circuitry of the FPGA provides the 1-bit sequence which is then low-pass filtered using a Krohn-Hite 3988 $8^{th}$ order frequency programmable filter box. The 1-bit sequence provided by the FPGA is clocked at 500 kHz and the cutoff frequency of the analog filter is initially set to 1.95 kHz which results in an OSR of 128. The generated analog noise signal is shown in FIG. 14. It is noted that the vertically plotted histogram is superimposed on the horizontally plotted time signal. As shown in the normal probability plot in FIG. 15, the PDF of the generated analog Gaussian noise signal is accurate to a distance of 3.87 σ from the mean. The robustness of the method and system for generating an analog Gaussian noise signal according to the invention has been tested by varying the analog low-pass filter bandwidth. In the above simulation it was noted, that when a first order analog low-pass filter is used, the quality of the PDF is relatively insensitive up to approximately five times the nominal filter bandwidth. Since here the programmable analog filter used is of $8^{th}$ order, it is expected that the Gaussian noise generation process is tolerant to higher filter bandwidths as more quantization noise is filtered out by the higher order filter. It has been observed that when the filter bandwidth is increased by a factor of ten, resulting in a bandwidth of 19.5 kHz, the standard deviation σ increased to 0.32 V and the PDF of the generated analog Gaussian noise signal is accurate to a distance of 3.75 σ from the mean. Along with the noise shaping nature of the ΣΔ modulation, it is possible to explain the insensitivity of the method and system for generating an analog Gaussian noise signal according to the invention to the order and bandwidth of the analog filtering process by a dithering of the non-dominant quantization noise level for low enough filter bandwidths. Indeed, it has been noticed that as the analog filter bandwidth is further increased the quality of the PDF compared to the Gaussian PDF slowly degrades.

Optionally, digital signals other than pulse-density modulated bit sequences as disclosed above are employed in the method and system for generating an analog Gaussian noise signal according to the invention such as a sequence of symbols approximating the Gaussian noise signal having the predetermined probability distribution function, bandwidth, and center frequency.

Further optionally, a predetermined sequence of symbols, the predetermined sequence of symbols approximating a Gaussian noise signal having a predetermined probability distribution function, bandwidth and center frequency is provided. As is evident to those skilled in the art, provision of a predetermined sequence of symbols is highly advantageous in testing procedures such as the one described below.

Figure 16A:
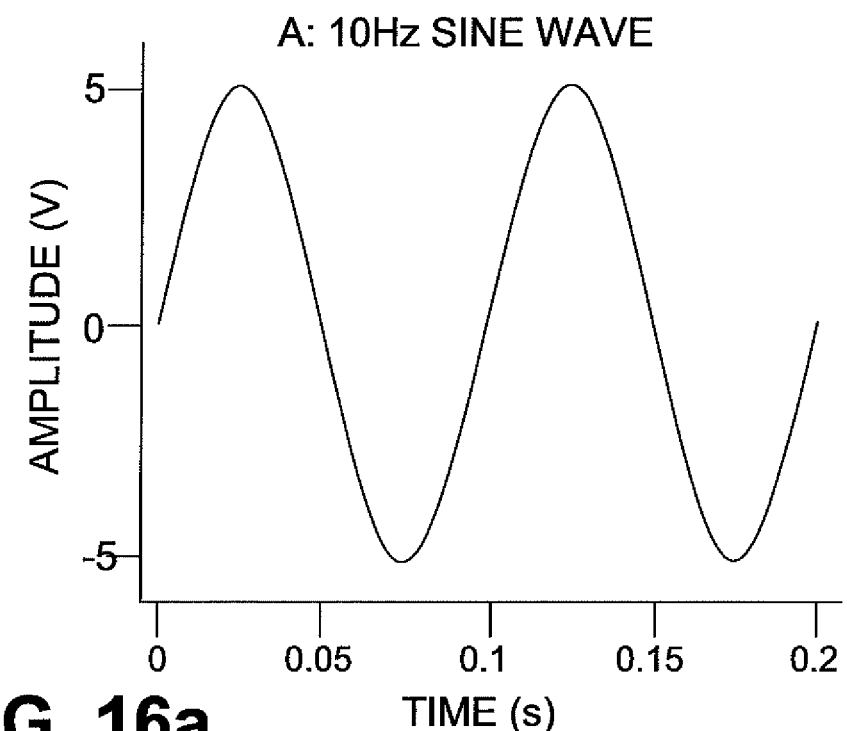
FIGS. 16a and 16b are diagrams illustrating a sinusoid and its histogram, respectively.
Figure 16B:
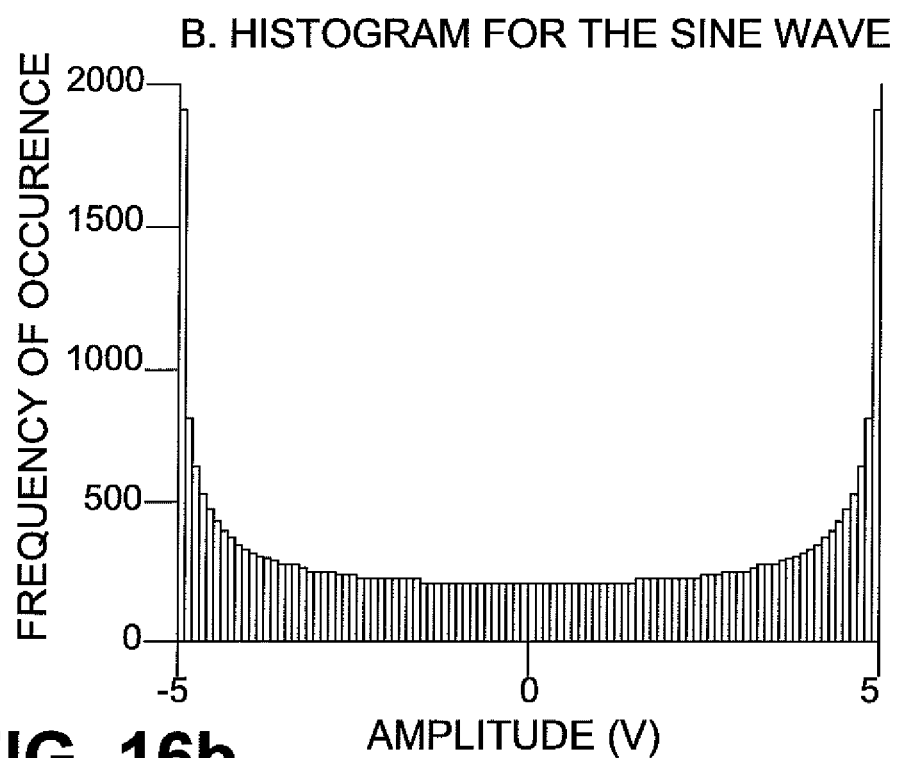

In histogram testing an ADC is excited using a signal having a known PDF and the output signal is then processed to generate a histogram. The simplest way to perform a histogram test is exciting the ADC using a linear ramp signal. This is due to the fact that the linear ramp signal has a uniform PDF; hence, ideally all ADC output codes occur an equal number of times in the output signal. The number of occurrences of every code is directly mapped to the width of the code; thus allowing Differential Non Linearity (DNL) and Integral Non Linearity (INL) calculations. Ramp tests are considered to be static tests, as the frequency of the ramp signal is usually low. To obtain dynamic DNL and INL information, an input signal whose slope is in the order of the slew-rate of the device is used instead. Also, generating a substantially accurate linear ramp is difficult and, for example, it is much easier to generate a substantially accurate sinusoidal waveform instead. Referring to FIGS. 16a and 16b, in sinusoidal histogram testing the PDF—or histogram—is pre-distorted to account for the non-uniform code density of a sinusoid. Consequently, it is possible to use any signal that has a known PDF for histogram testing as long as the test results are properly normalized. Since a sinusoid is a deterministic signal, its PDF strongly depends on its magnitude and phase characteristics and any type of distortion affects its histogram. Being periodic, the sampling frequency is carefully chosen to avoid redundancy in the sampled data. In addition, as depicted in FIG. 16a, a sinusoid spends most of its time near the upper and lower peaks than the center. As a result, to achieve predetermined test accuracy many samples are collected to ensure that there are enough code occurrences for the entire range of the ADC under test. On the other hand, a Gaussian noise signal is completely described by its first order statistics—its mean and variance. Also, any additional noise present in the test system will only add to the variance. An error in the variance only induces a gain error which is easily accounted for if the gain of the ADC is known beforehand. In addition, since the method and system for generating an analog Gaussian noise signal according to the invention provides a programmable Gaussian noise generator, it is possible to specifically choose the variance to have enough code occurrences in the range of the ADC for a predetermined resolution. In G. Evans, J. Goes, and N. Paulino: "*On-Chip Built-in Self-Test of Video-Rate ADCs using a 1.5 V CMOS Noise Generator*", IEEE ISCAS, 2005, pp. 796-799, histogram testing using a Gaussian noise signal generated by the amplification of the thermal noise of a resistor has been demonstrated. However, since the test signal used is purely random, this method is not amenable to a production test environment. To obtain consistent reliable test results within a given confidence interval, many samples are collected and averaged. In contrast, the analog Gaussian noise signal generated using the method and system for generating an analog Gaussian noise signal according to the invention is substantially predictable. In other words, the PDF of the test signal is known and predictable. Consequently, it is sufficient to execute the histogram test only once. An additional benefit of the analog Gaussian noise signal generated using the method and system for generating an analog Gaussian noise signal according to the invention is that it is programmable for any frequency band within $F_s/2$. Therefore, it is possible to use the method and system for generating an analog Gaussian noise signal according to the invention to investigate the behavior of the ADC for various frequency bands, which is not possible to achieve using linear ramp or sinusoidal histogram testing.

Figure 17:
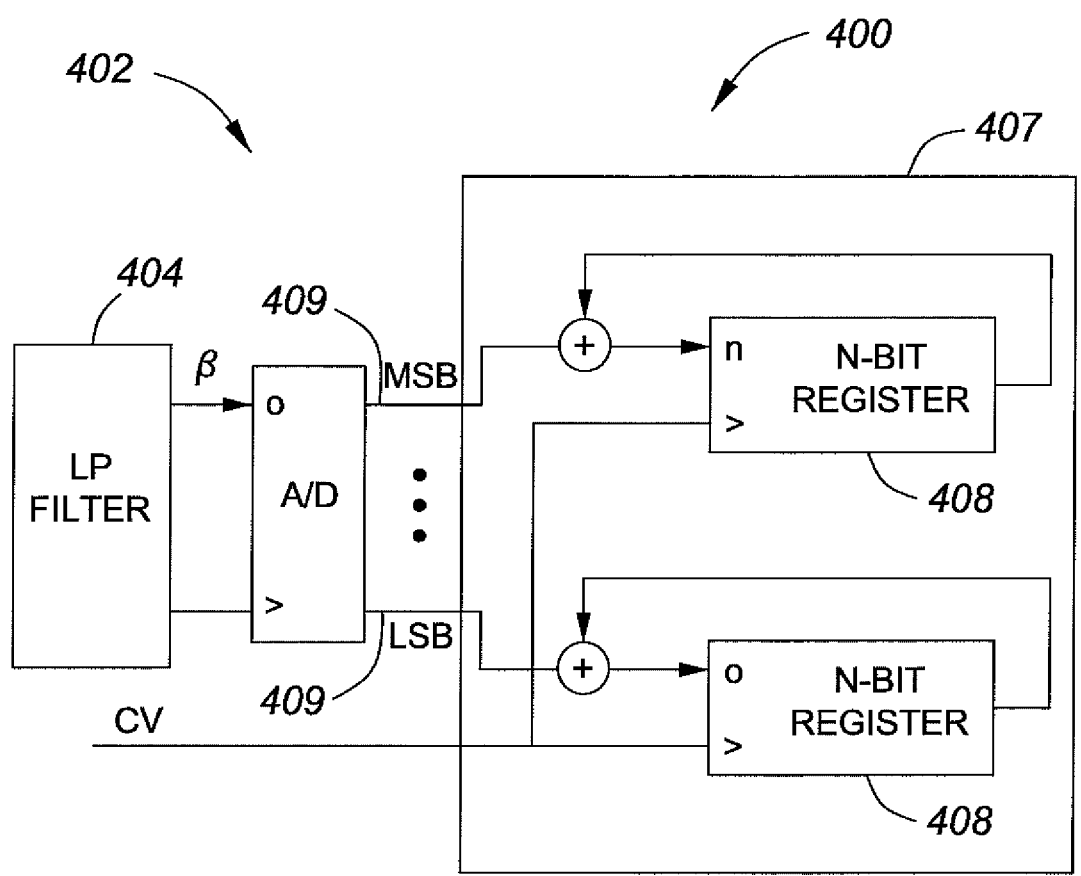
FIG. 17 is a simplified block diagram of a system for histogram testing according to the invention.

Referring to FIG. 17, a histogram test set-up 400 according to the invention is shown. It is noted, that while the histogram test setup is described for testing an ADC it is not limited thereto, but also applicable for histogram testing of numerous other Devices Under Test (DUTs). As described above, MATLAB/SIMULINK™ is used to generate a pulse-density modulated 1-bit sequence representing a Gaussian noise signal having a predetermined PDF, bandwidth and center frequency which is stored in memory 402—for example a circular memory—and converted into an analog Gaussian noise signal using DAC 404 such as a first order analog low-pass filter. Registers 408 are connected to respective output ports 409—for the Most Significant Bit (MSB) to the Least Significant Bit (LSB)—to capture the respective output data of the ADC 406 under test. The number of samples in each output level is tabulated in order to determine the PDF for each level. The following are parameters used for this example test but, as is evident, the histogram test set-up 400 is not limited thereto. The pulse-density modulated 1-bit sequence representing a Gaussian noise signal is again encoded by mapping the high bits to 1.65 V and the low bits to −1.65 V. The DUT 406 is an 8-bit non-ideal ADC having a full scale range of −6 V to 6V. In order to ensure that all code levels occur, the mean of the analog Gaussian noise signal was set to 0 V ad the standard deviation σ has been set to 0.3 V, which is ¼$^{th}$ of the full scale range. Further, to ensure that the analog Gaussian noise signal covers the entire full scale range of the ADC 406, the mean and the standard deviation have been determined as follows;

$$\mu = \frac{V_{MAX} + V_{MIN}}{2}, \sigma = \frac{V_{MAX} - V_{MIN}}{4}. \quad (5)$$

Figure 18A:
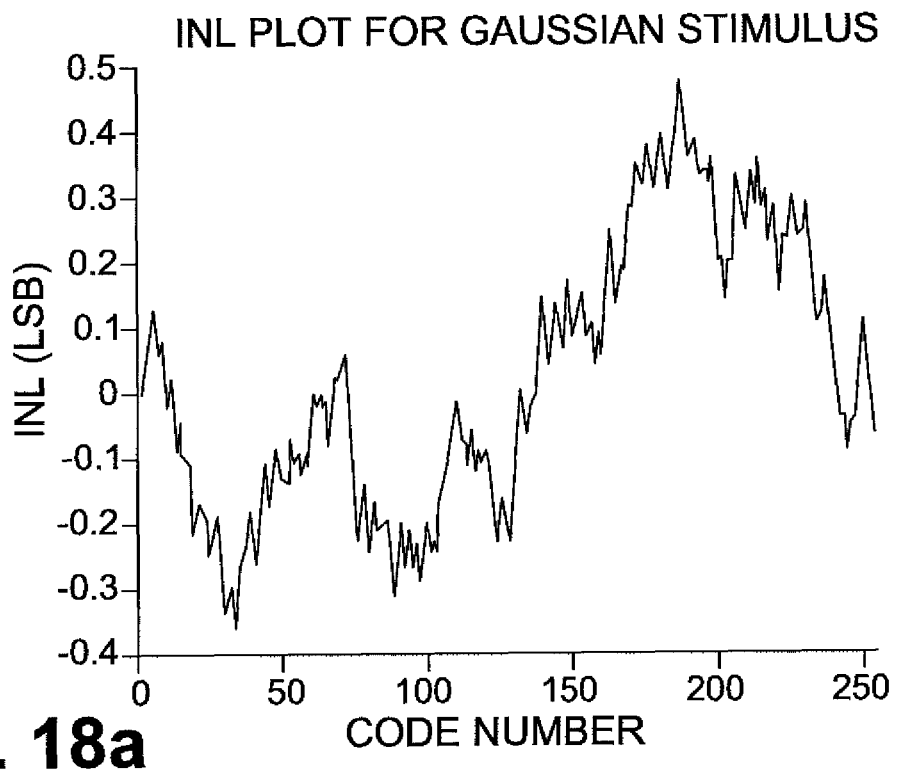
FIGS. 18a and 18b are diagrams illustrating INL test results an analog Gaussian noise signal and an ideal ramp signal, respectively.
Figure 18B:
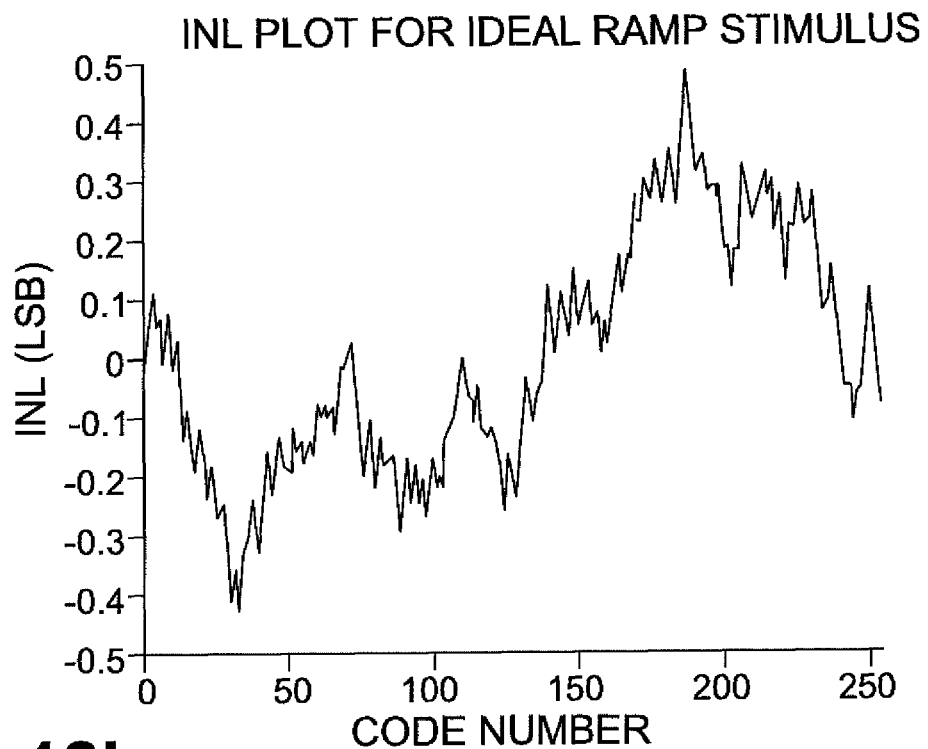

FIGS. 18a and 18b show calculated INL results for the analog Gaussian noise signal and an ideal linear ramp test signal, respectively, with 4 million points sampled for the calculations. Both INL plots are closely matched and the maximum difference is less than 0.04 LSB.

Figure 19A:
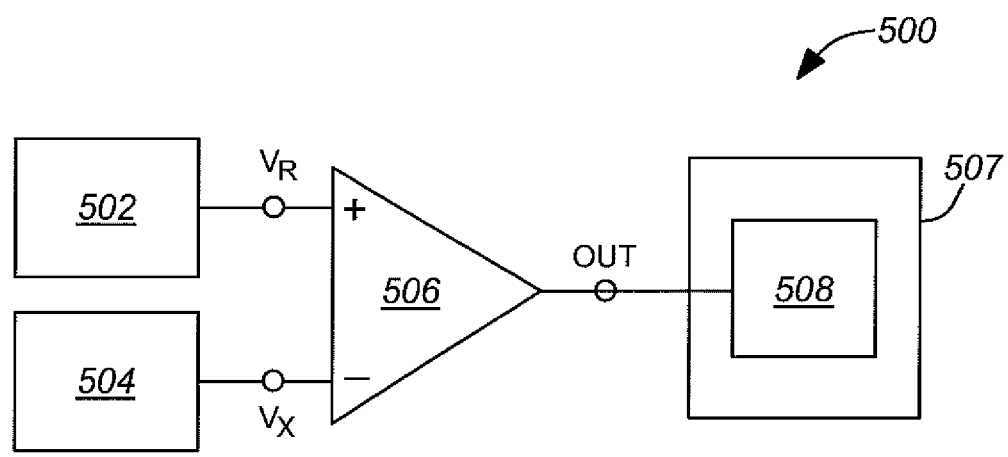
FIG. 19a is a simplified block diagram of a probabilistic digitizer for digitizing a voltage signal according to the invention.
Figure 19B:
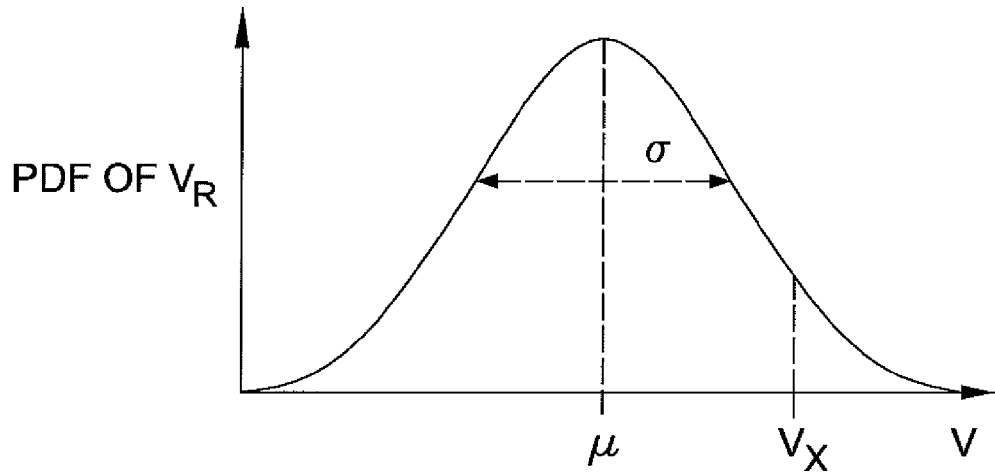

Referring to FIGS. 19a and 19b, a probabilistic digitizer 500 according to the invention is shown. Here, an analog Gaussian noise signal having a predetermined PDF, bandwidth and center frequency generated using the method and system for generating an analog Gaussian noise signal according to the invention is used as a high-quality predictable dithering signal for high-resolution digitization. A source 502 for providing an analog Gaussian noise signal having a predetermined PDF, bandwidth and center frequency generated using the method and system for generating an analog Gaussian noise signal according to the invention is connected to a first—$V_R$—input port of a comparator 506, while a second input port—$V_X$—of the comparator 506 is connected to a voltage source 504 for providing a voltage signal $V_X$ to be digitized. An output port of the comparator 506 is connected to output circuitry 507. In operation, an analog Gaussian noise signal $V_R$ having a predetermined PDF—mean μ and standard deviation σ—is provided to the first input port of the comparator 506, while the voltage signal $V_X$ is provided to the second input port of the comparator 506. Using the comparator 506 and a counter 508 of the output circuitry 507, the number of times when $V_R<V_X$ is counted and data indicative of comparator output samples are provided. After collecting a predetermined number of comparator output samples in the output circuitry 507, a probabilistic method is used to determine the a voltage level of the voltage signal $V_X$. The number of times when $V_R<V_X$ is divided by the total number of output samples to obtain the probability $P(V_R<V_X)$. Then the inverse cumulative distribution function $\Phi^{-1}$ is applied to the calculated probability P and the voltage level of the voltage signal $V_X$ is determined as follows:

$$V_X = \sigma \times \Phi^{-1}(P) + \mu. \quad (6)$$

The probabilistic digitizer 500 has been implemented using MATLAB/SIMULINK™. For the simulation, a sinusoid having a mean of 0 V and amplitude of 1.35 V has been digitized. In order to ensure that the entire sinusoid is covered within 3 σ of the analog Gaussian noise signal, the mean of the analog Gaussian noise signal was set to 0 V and the standard deviation to 0.45 V. Coherent sampling was used with the total number of collected samples N being equal to 128 and the bin number M being equal to 17.1 million comparisons have been performed for each voltage level that was digitized. Consequently, the total test time is given by:

$$\text{TEST-TIME} = N_{Noise} \times T_{Comp} \times N_{Samples} \quad (7)$$

where $N_{Noise}$ is the number of comparisons to the noise signal, $T_{Comp}$ is the time necessary for each comparison, and $N_{samples}$ is the number of digitized samples. If the comparator 506 is operated at 100 MHz, the total test time for is 1.28 seconds. The digitized signal has a Signal to Noise-plus-Distortion Ratio (SNDR) of 43.41 dB which gives approximately 7 bits of equivalent resolution.

Since the characteristics of the dithering Gaussian noise signal are user-determined, it is possible to increase the effective resolution by repeating the same digitization process with an analog Gaussian noise signal having a PDF that "zooms" in around the voltage levels being digitized. Above, a sinusoid ranging between −1.35 V and 1.35 V was digitized with a resolution of 7 bits. Subsequently, the analog Gaussian noise signal is reprogrammed to have, for example, a mean μ equal to the previously digitized voltage level and a standard deviation σ of approximately 0.1 V. Therefore, the "zooming" method for each voltage value being digitized is summarized as follows:

1. Reset the mean μ of the analog Gaussian noise signal to the current measured voltage value;
2. Reset the standard deviation σ to focus on the current measured voltage value; and,
3. Repeat the above probabilistic digitization process.

Figure 20A:
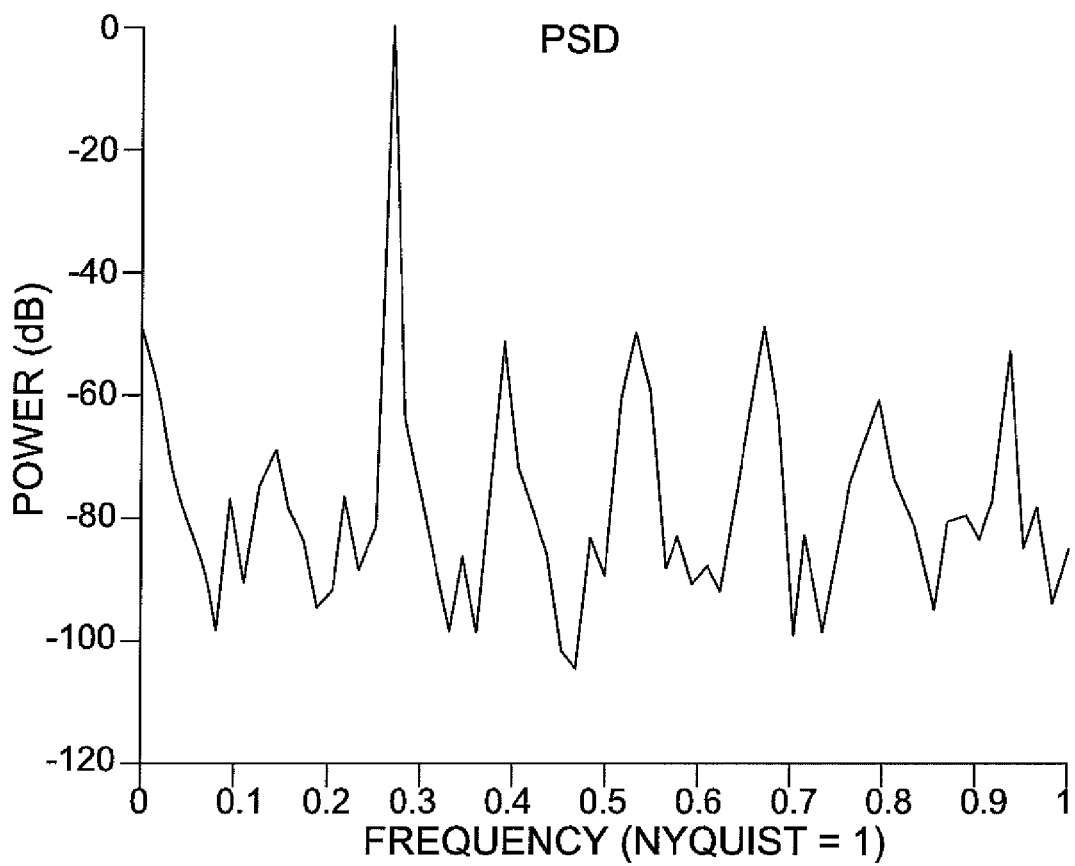
FIGS. 20a and 20b are diagrams illustrating power spectral density plots of the digitized signal using the system shown in FIG. 19a without "zooming" and with "zooming", respectively.
Figure 20B:
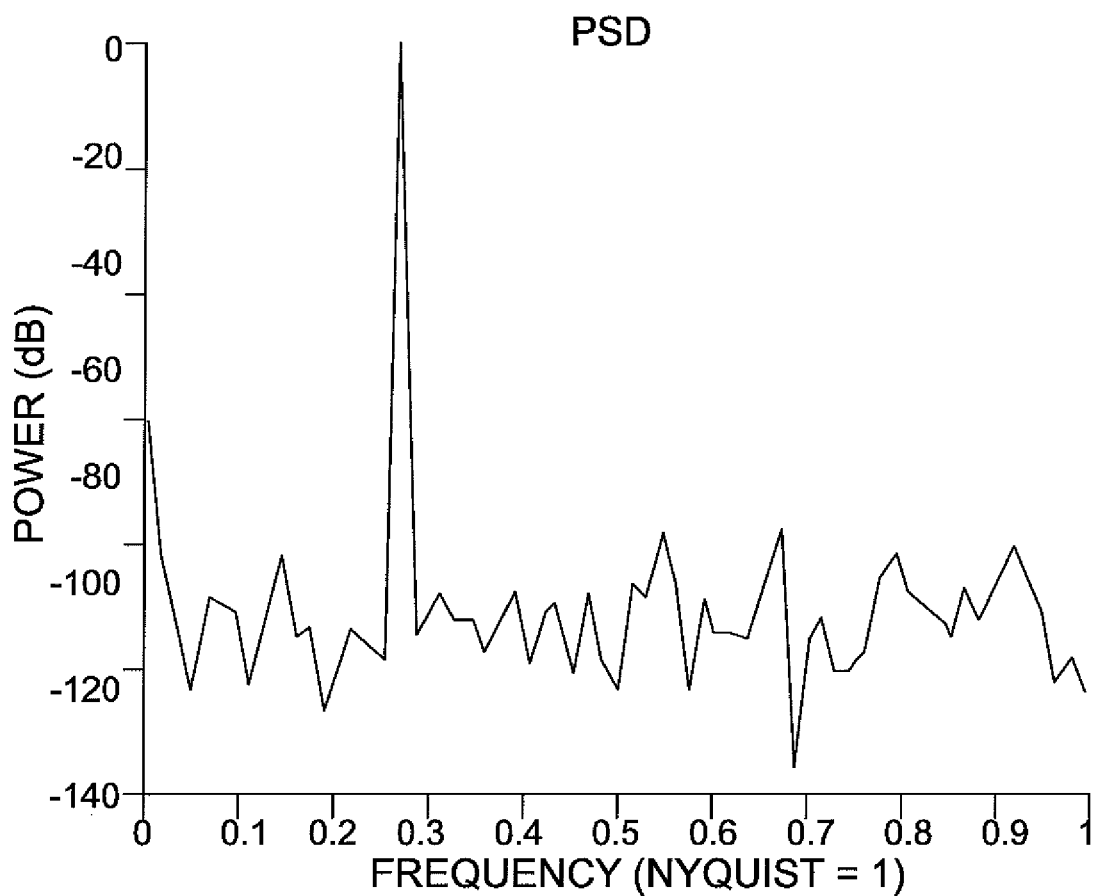

FIGS. 20a and 20b show a Power Spectral Density (PSD) plot of the digitized voltage signal without "zooming" and with "zooming", respectively. As depicted in FIGS. 20a and 20b, the noise floor of the PSD significantly decreases when the "zooming" method is used. The SNDR of the digitized voltage signal increased to 84.17 dB which gives an equivalent resolution of approximately 14 bits. Optionally, the "zooming" method is applied iteratively to further increase the resolution. For the complete digitization process, the total test-time according to equation (7) is multiplied by a "zooming" factor Z as follows:

$$\text{TEST-TIME} = N_{Noise} \times T_{Comp} \times N_{Samples} \times Z. \quad (8)$$

In the case shown in FIG. 20b, the "zooming" process has been applied only once, the factor Z equals 2 and the total test-time has doubled.

In modern digital systems such as, for example, microprocessors and mixed-signal circuits used in digital communication systems, Phased-Locked-Loops (PLLs) are frequently used building blocks for realizing functions such as, for example, clock distribution and clock recovery. When embedded in high-speed digital communication systems, PLLs have to comply with very stringent specifications. An important parameter of a PLL is its jitter transfer function which is defined as the ratio of output jitter to the applied input jitter as a function of frequency. The jitter transfer function is determined by applying a jitter clock to the input of the PLL and observing the output of a voltage-controlled oscillator for different frequencies.

Figure 21A:
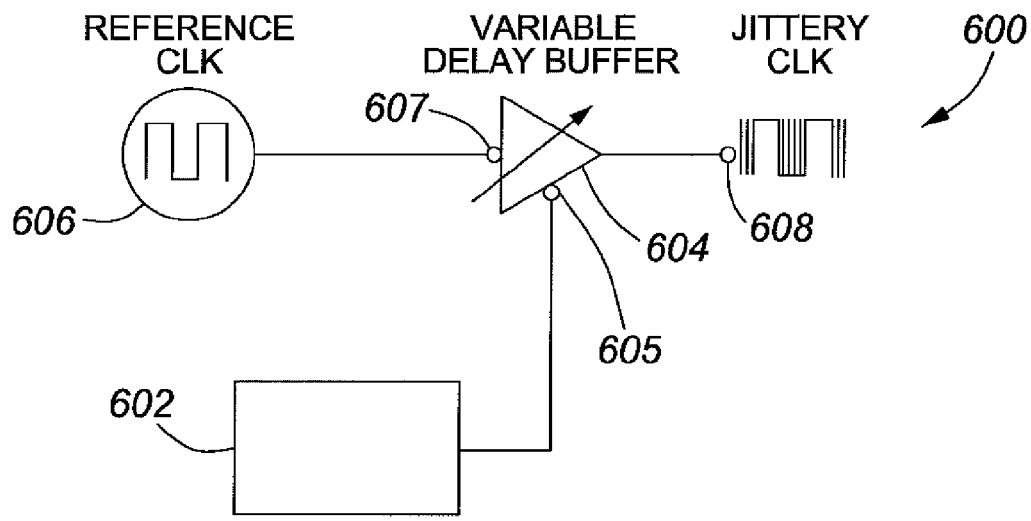
FIG. 21a is a simplified block diagram illustrating a programmable jitter source according to the invention.
Figure 21B:
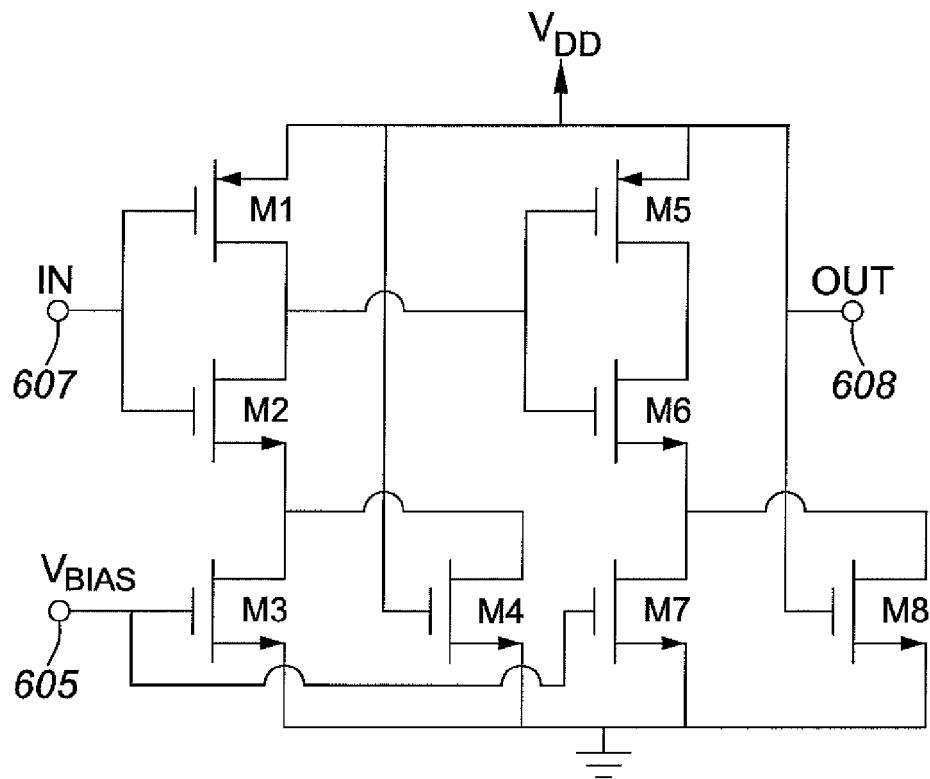

Referring to FIGS. 21a and 21b, a programmable jitter source 600 according to the invention is shown. Here, an analog Gaussian noise signal having a predetermined PDF, bandwidth and center frequency generated using the method and system for generating an analog Gaussian noise signal according to the invention is mapped into time-domain for providing a high frequency jitter source.

Figure 22:
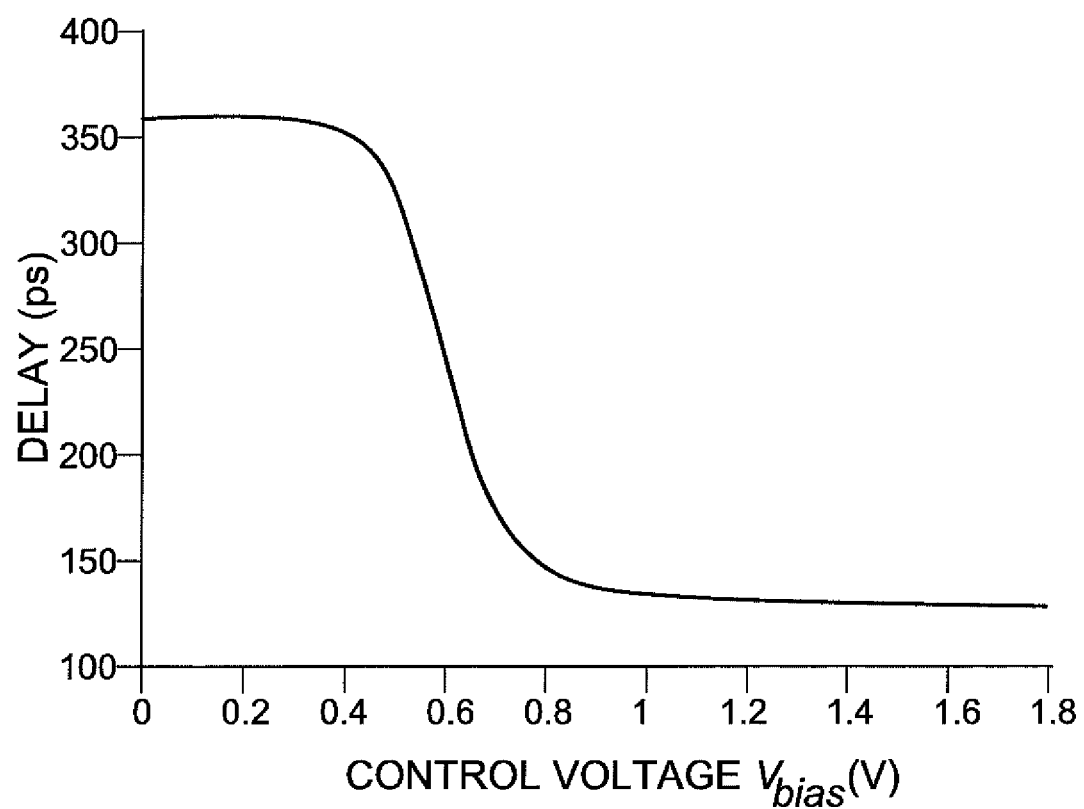
FIG. 22 is a diagram illustrating simulated delay versus control voltage of the voltage-controlled delay buffer shown in FIG. 21b.

A source 602 for providing an analog Gaussian noise signal having a predetermined PDF, bandwidth and center frequency generated using the method and system for generating an analog Gaussian noise signal according to the invention is connected to a control voltage input port 605 of voltage-controlled delay buffer 604. Input port 607 of the voltage-controlled delay buffer 604 is connected to reference clock 606 for receiving a reference clock signal. In operation, the reference clock signal received at input port 607 is transformed into a predetermined jitter clock signal using the control voltage received from the source 602 and provided via output port 608. The voltage-controlled delay buffer is, for example, realized using the circuitry shown in FIG. 21b. It is noted that the circuit shown in FIG. 21b is calibrated to predetermine the mapping between the applied control voltage and the produced delay. As shown in FIG. 22, for a 0.18 µm CMOS process the delay varies in a non-linear fashion as the control voltage is varied between 0 V and 1.8 V. However, for control voltages between approximately 0.5 V and 0.65 V substantially linear delays varying between approximately 320 ps and 200 ps are achieved. Consequently, applying a Gaussian noise signal to the control voltage within the linear region produces a delay also having a Gaussian distribution. Furthermore, since by using the Gaussian noise source according to the invention the Gaussian control voltage is programmable, it is possible to use the delay buffer even within the non-linear regions if the transfer function between the delay and the control voltage is known, i.e. it is possible to pre-distort the Gaussian signal to account for the non-linearity.

Noise Power Ratio (NPR) test is a measure for in-band distortions. It is defined as the ratio between the in-band distortion power and the useful signal power spectral densities when an in-band noise spectrum slice is removed as discussed in A. Geens, Y. Rolain, W. Van Moer, K. Vanhoenacker, J. Schoukens, "Discussion on Fundamental Issues of NPR Measurements," IEEE Trans. on Instrumentation and Measurement, Vol. 52, NO. 1, February 2003, pp. 197-202. On the other hand, Adjacent Power Ratio (ACPR) is an out of band distortion measure. It is defined as the ratio of power in the main channel to the adjacent channel power as discussed in S. Bhattacharya, G. Srinivasan, S. Cherubal, A. Chatterjee, "Test Time Reduction for ACPR Measurement of Wireless Transceivers Using Periodic Bit-Stream Sequences," Proc. IEEE International Workshop on Electronic Design, Test and Applications, January 2004, pp. 372-377.

For NPR and ACPR signal generation relying on $\Sigma\Delta$ modulation for use in manufacturing environments, high frequency and high attenuation band-pass filters are used in generating an analogue test signal. For example, to synthesize a periodic analog signal a sinusoid, a sequence of digital bits is repeated as to approximate the output signal of a 1-bit $\Sigma\Delta$ modulator when driven by a periodic signal and then filtered using an appropriate analog band-pass filter.

A low-cost, high-frequency signal generation scheme suitable for Noise Power Ratio (NPR) and Adjacent Channel Power Ratio (ACPR) tests comprises digitally encoding a desired stimulus using $\Sigma\Delta$ modulation and then applying the resulting bit-stream to an appropriate analog filter. In experiments, a desired bit sequence was generated using Matlab, stored in the digital memory of a Teradyne Ultra-Flex tester and then filtered using a high frequency programmable Trilithic band-pass filter. The versatility of the generation process, its hardware flexibility and the relatively high signal quality achieved makes it a promising solution for a production test environment. Unlike commercially available expensive arbitrary waveform generators, the generated wideband noise signal used for NPR/ACPR tests does not suffer from power limitations since any voltage level is useful in the proposed implementation. Though the experimentation was performed using multipurpose equipment, systems specifically designed for generating the test signals according to the hereindescribed methods are optionally significantly simplified.

Figure 23A:
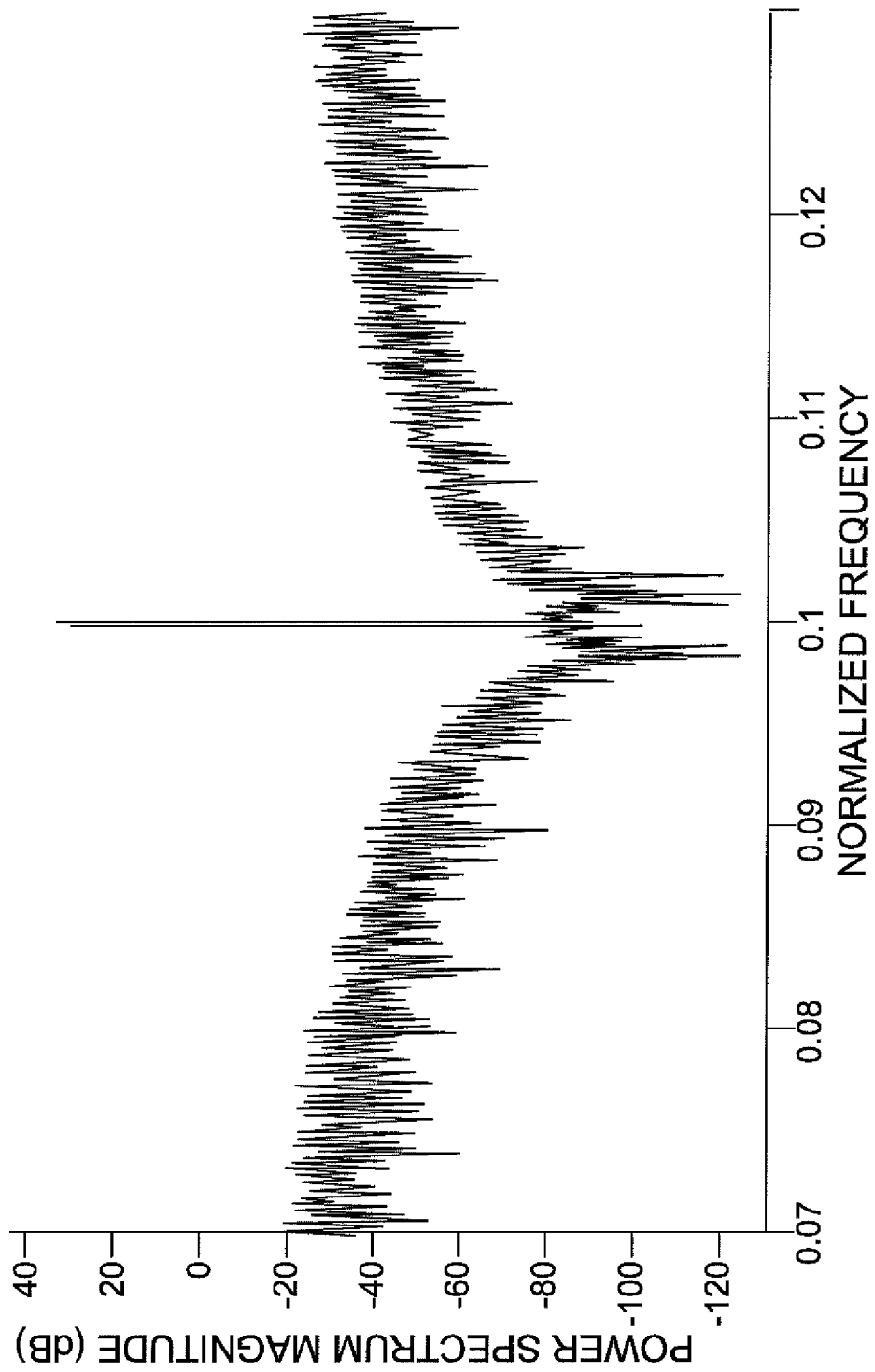
FIG. 23a is a graph of a simulated bit sequence spectrum encoding a single tone signal.
Figure 23B:
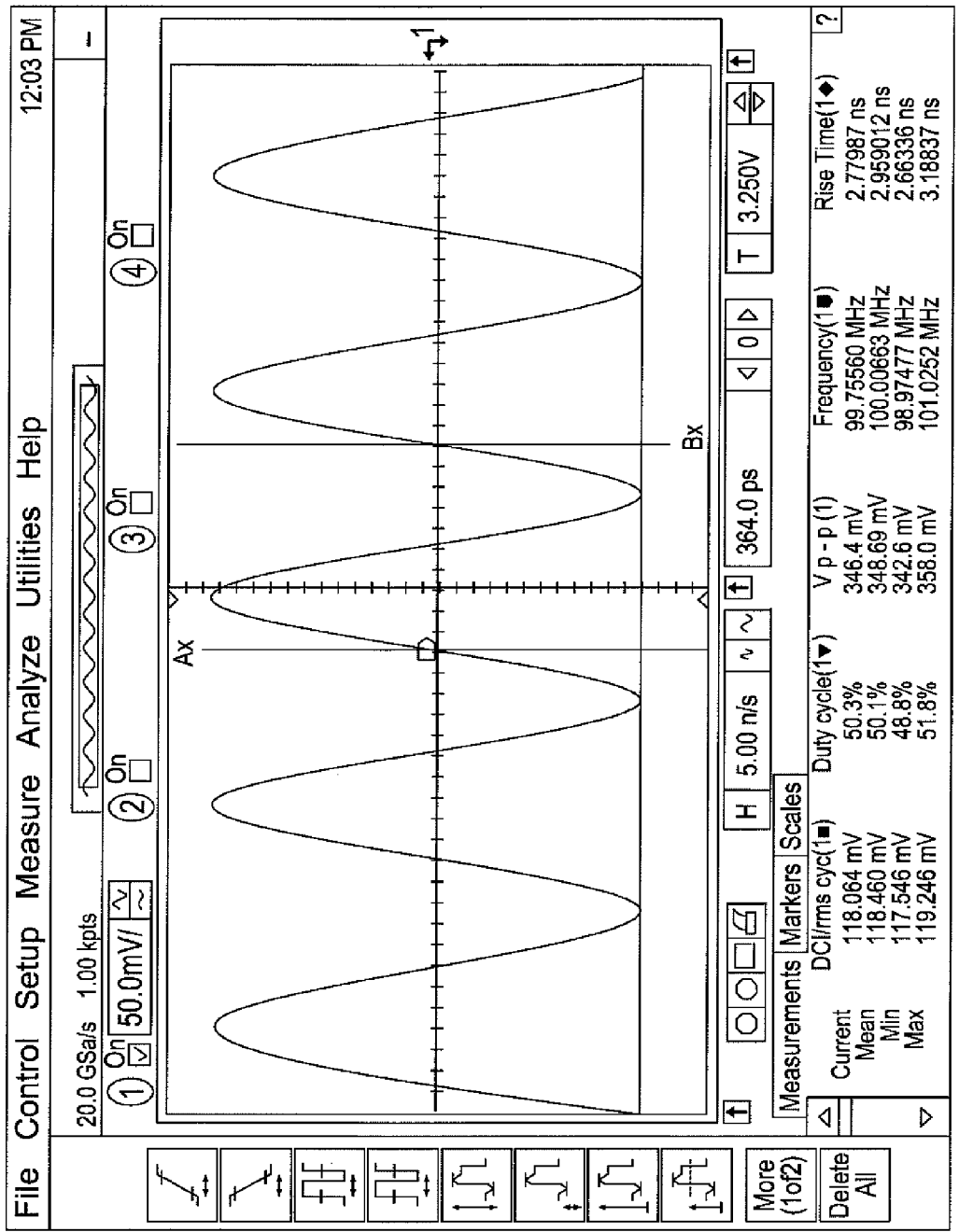
FIG. 23b is a graph of a generated single-tone signal.

The technique described above is investigated by generating a high-frequency single-tone test signal. The desired test signal is digitally encoded using pulse-density modulation and is converted to the analog domain using an analog reconstruction filter. The single-tone test analog signal is encoded digitally using Matlab. The modulator has band-pass characteristics, an order of 8, an oversampling ratio of 200, and a sampling frequency of 2.0 GHz. The sinusoid was encoded assuming that the voltage supply, VDD, is equal to 1 V, that the tone is located at 100 MHz, and that its amplitude is equal to 0.40 V. Since a Trilithic band-pass filter box having a 5% bandwidth around the programmed center frequency is to be used in the hardware implementation, the band-pass filter bandwidth was set to 5 MHz. Of course other settings are optionally selected. As depicted from the spectrum of the bit sequence shown in FIG. 23, the quantization noise is pushed away from the main tone. In simulation, an SNR of 70.1 dB was achieved within a 5 MHz bandwidth around the tone. The single-tone setup described above was realized in hardware as shown in FIG. 23b and achieved similar results though the SNR was not quite as good. This was then isolated to limitations of the selected hardware.

Figure 24:
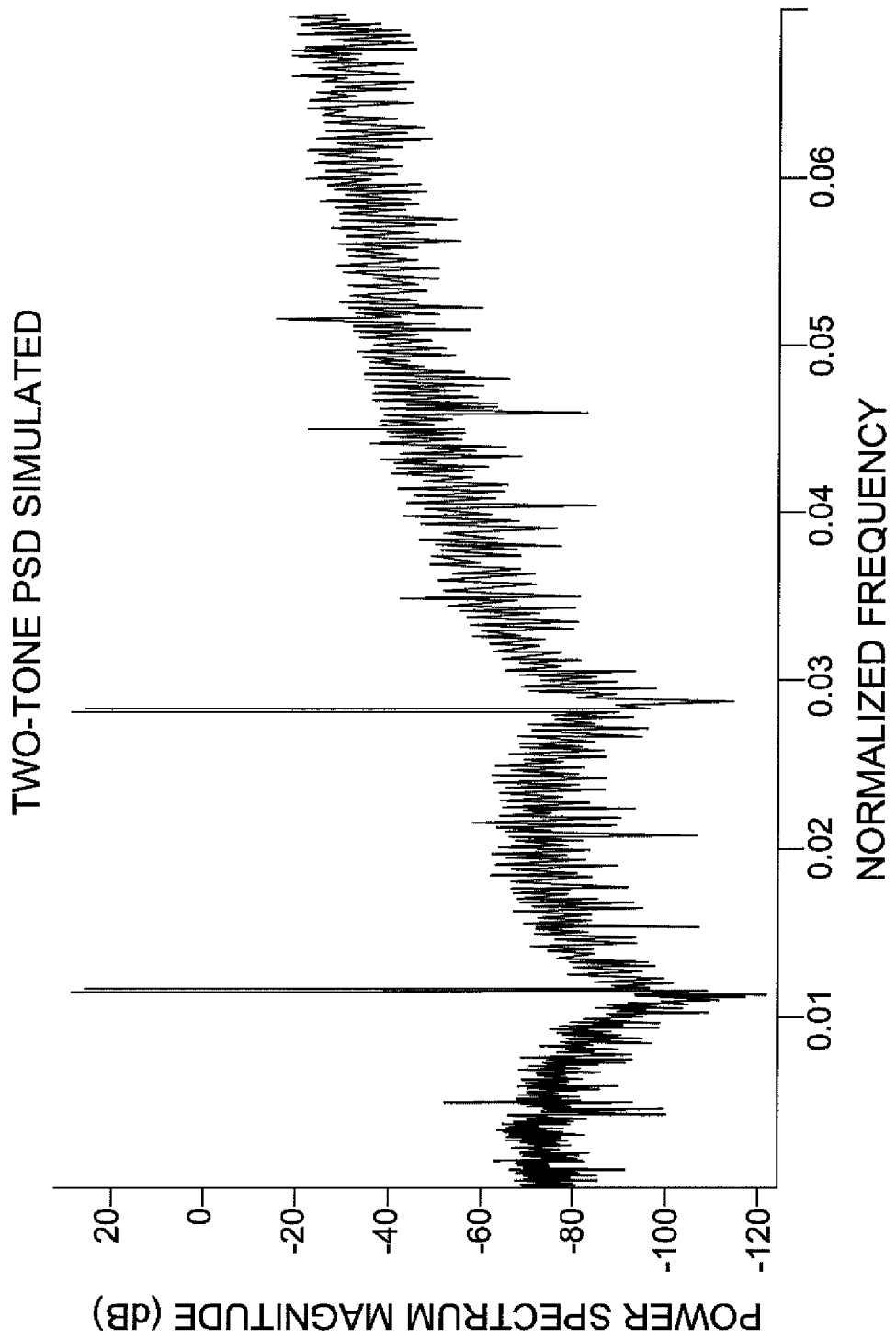
FIG. 24 is a graph of a simulated bit sequence spectrum encoding a two tone signal.

A two-tone signal having a wide separation between the tones was also produced in simulation and experimentally. The simulation was executed under the following settings: a 1 V power supply, a sampling frequency of 6 GHz, an OSR of 30, a modulator order of 8, a tone amplitude of 0.2 V, tones at 35 MHz and 85 MHz, and a low-pass filter with a 3-dB frequency of 100 MHz. Under these simulation settings, an SNR of 64.87 dB over the 100 MHz bandwidth was achieved. Here again, as shown from the simulated power spectrum density of the bit stream, FIG. 24, quantization noise is outside the band of interest. Of course other settings are optionally selected. The single-tone setup described above was realized in hardware and achieved similar results though the SNR was not quite as good. This was then isolated to limitations of the selected hardware.

Figure 25A:
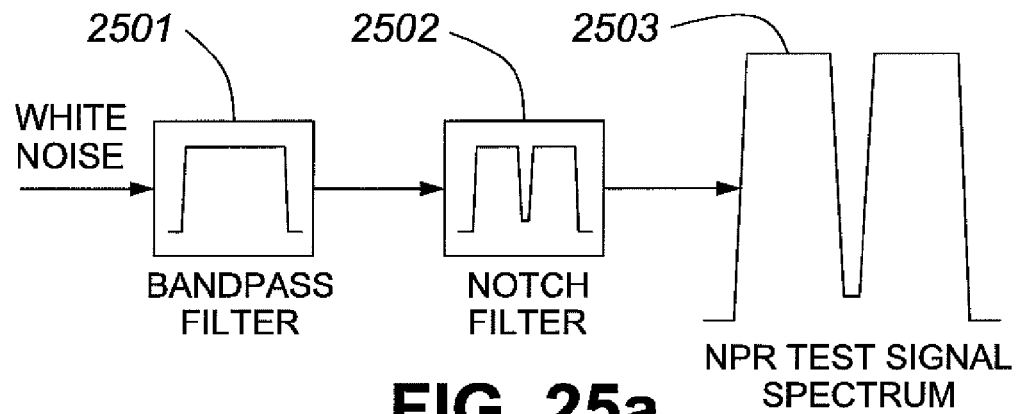
FIG. 25a is a simplified block diagram of a traditional NPR test scheme.

In analog channels, NPR measures the "quietness" of an unused channel in a multi-channel system when there is random activity on the others. A traditional NPR test scheme has been as shown in FIG. 25a. First, a white Gaussian noise source 2501 is applied to a band-pass filter 2502 to obtain band-limited noise. Then, the resulting signal is applied to a notch filter 2503 to remove the noise in a given channel. The main problem with this method is that a very narrow and deep notch filter is required.

Figure 25B:
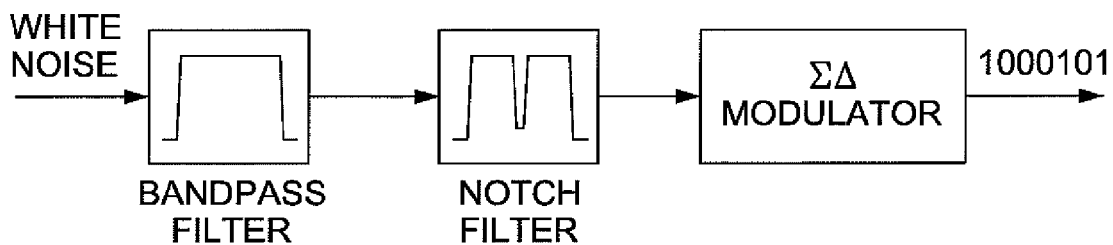
FIG. 25b is a simplified block diagram of a modified NPR test scheme according to the invention.
Figure 25C:
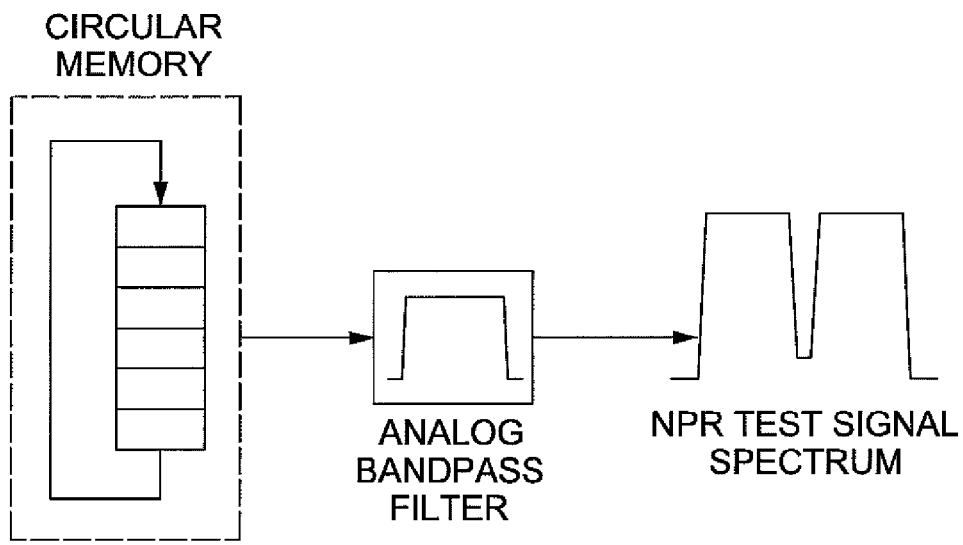
FIG. 25c is a simplified block diagram of a modified NPR test hardware scheme according to the invention.

For NPR test signals, a noise generation method was modified to include a notch filter implemented in the digital domain as shown in FIG. 25b; hence, reducing the NPR test hardware complexity to the scheme outlined in FIG. 25c.

Figure 26A:
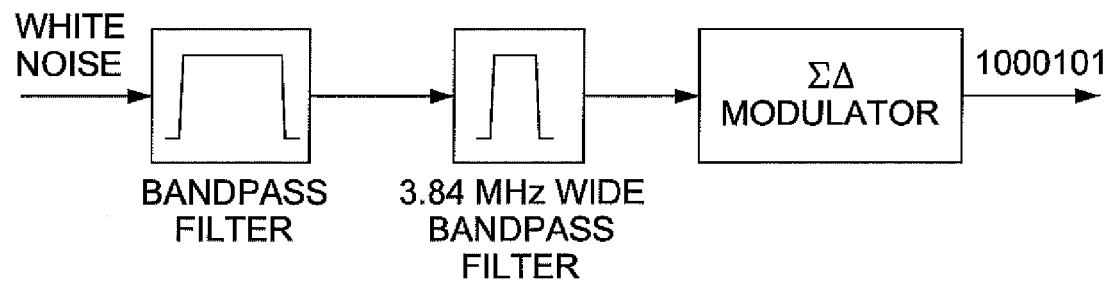
FIG. 26a is a simplified block diagram of a ACPR test signal encoding scheme; and, FIG. 26b is a simplified block diagram of a modified ACPR test hardware scheme.
Figure 26B:
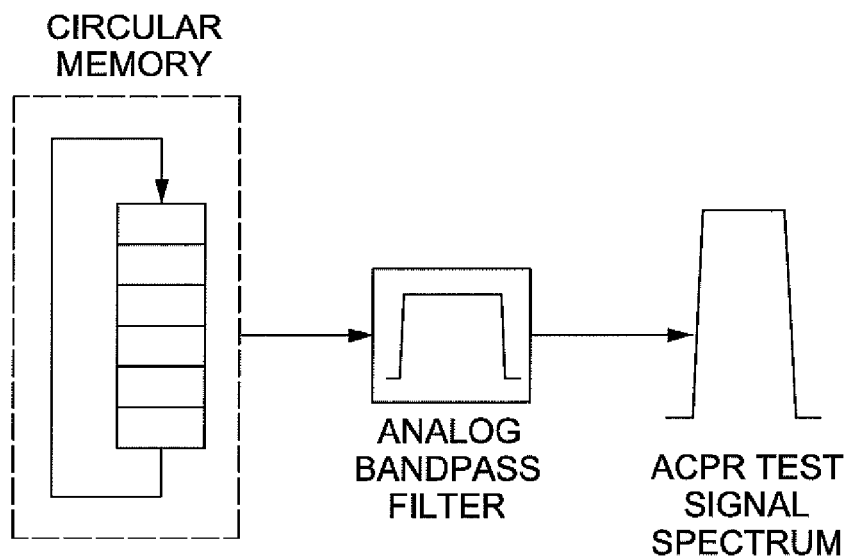

Adjacent channel power ratio (ACPR) test is used to characterize the distortion of subsystems (e.g. ADCs) and the likelihood that it may cause interference in a neighboring channel. It is defined as the ratio of power in the adjacent channel to the power in the transmitted channel. Here again, just as for NPR test generation the proposed ACPR test generation scheme uses ΣΔ modulation to digitally encode the ACPR test stimulus and the signal is recovered by applying the bit stream to an appropriate band-pass filter. The difference with NPR test signal generation is that the desired spectrum is flat. Referring to FIG. 26a, the method for encoding the ACPR is as follows, first a white noise source is bandlimited using a broadband bandpass filter. Then, a channel wide filter is used (3.84 MHz for CDMA) to filter out noise in the adjacent channels. A ΣΔ modulator is then used to encode the bit sequence. As for the NPR test scheme, FIG. 26b shows that only a circular memory and wideband analog bandpass filter are required in hardware for generating the ACPR test stimulus.

Thus, the hereindescribed method of test signal generation is applicable to various forms of test signals including NPR and ACPR.

Of course, the method is implementable using different systems and different specific hardware depending on design criteria and other choices.

Numerous other embodiments of the invention will be apparent to persons skilled in the art without departing from the spirit and scope of the invention as defined in the appended claims.

What is claimed is:

1. A system for generating an analog Gaussian noise signal comprising:

source circuitry comprising a memory, in operation the source circuitry providing from the memory one of a pulse-density modulated 1-bit sequence and a pulse-density modulated multi-bit sequence representing a Gaussian noise signal having a predetermined probability distribution function, bandwidth and center frequency, each bit in the sequence being predetermined;

processing circuitry connected to the source circuitry, in operation the processing circuitry reducing high frequency components within the one of a pulse-density modulated 1-bit sequence and a pulse-density modulated multi-bit sequence to generate an analog Gaussian noise signal having the predetermined probability distribution function, bandwidth and center frequency; and, an output port connected to the digital-to-analog converter, in operation the output port providing the analog Gaussian noise signal having the predetermined probability distribution function, bandwidth and center frequency.

2. A system for generating an analog Gaussian noise signal as defined in claim 1 wherein the source circuitry comprises non-volatile memory having stored therein data indicative of at least one of a pulse-density modulated 1-bit sequence and a pulse-density modulated multi-bit sequence representing a Gaussian noise signal having a predetermined probability distribution function, bandwidth and center frequency.

3. A system for generating an analog Gaussian noise signal as defined in claim 1 wherein the processing circuitry comprises an analog low-pass filter.

4. A system for generating an analog Gaussian noise signal as defined in claim 3 wherein the analog low-pass filter comprises a first order analog low-pass filter.

* * * * *